(12) United States Patent
Willemen

(10) Patent No.: US 11,495,593 B2
(45) Date of Patent: *Nov. 8, 2022

(54) SEMICONDUCTOR DEVICE

(71) Applicant: Infineon Technologies AG, Neubiberg (DE)

(72) Inventor: Joost Adriaan Willemen, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/085,661

(22) Filed: Oct. 30, 2020

(65) Prior Publication Data

US 2021/0050342 A1     Feb. 18, 2021

Related U.S. Application Data

(63) Continuation of application No. 16/538,211, filed on Aug. 12, 2019, now Pat. No. 10,847,509.

(30) Foreign Application Priority Data

Aug. 13, 2018  (DE) .......................... 102018213635.1

(51) Int. Cl.
*H01L 27/02* (2006.01)
*H01L 29/06* (2006.01)
(Continued)

(52) U.S. Cl.
CPC .......... *H01L 27/0248* (2013.01); *H01L 23/60* (2013.01); *H01L 27/0255* (2013.01);
(Continued)

(58) Field of Classification Search
CPC . H01L 27/0248; H01L 23/60; H01L 27/0255; H01L 27/0814; H01L 29/0615;
(Continued)

(56) References Cited

U.S. PATENT DOCUMENTS 6,614,087 B1   9/2003 Morishita et al.
10,847,509 B2 * 11/2020 Willemen .............. H01L 29/36
(Continued)

FOREIGN PATENT DOCUMENTS

JP           2014138054 A      7/2014

*Primary Examiner* — Shouxiang Hu
(74) *Attorney, Agent, or Firm* — Slater Matsil, LLP

(57) ABSTRACT

A semiconductor device includes a composite pn-junction structure in a semiconductor substrate, wherein the composite pn-junction structure has a first junction grading coefficient $m_1$, with $m_1 \geq 0.50$. The composite pn-junction structure includes a first partial pn-junction structure and a second partial pn-junction structure, wherein the first partial pn-junction structure has a first partial junction grading coefficient $m_{11}$, and wherein the second partial pn-junction structure has a second partial junction grading coefficient $m_{12}$. The first partial junction grading coefficient $m_{11}$ is different to the second partial junction grading coefficient $m_{12}$, with $m_{11} \neq m_{12}$. At least one of the first and second partial junction grading coefficients $m_{11}$, $m_{12}$ is greater than 0.50, with $m_{11}$ and/or $m_{12} > 0.50$. The first junction grading coefficient $m_1$ of the composite pn-junction structure is based on a combination of the first and second partial junction grading coefficients $m_{11}$, $m_{12}$.

20 Claims, 15 Drawing Sheets

(51) Int. Cl.
*H01L 29/861* (2006.01)
*H01L 27/08* (2006.01)
*H01L 29/36* (2006.01)
*H01L 23/60* (2006.01)

(52) U.S. Cl.
CPC ...... *H01L 27/0814* (2013.01); *H01L 29/0615* (2013.01); *H01L 29/0649* (2013.01); *H01L 29/0688* (2013.01); *H01L 29/36* (2013.01); *H01L 29/8618* (2013.01)

(58) Field of Classification Search
CPC . H01L 29/0649; H01L 29/0688; H01L 29/36; H01L 29/8618; H01L 29/861; H01L 29/0603; H01L 29/8611; H01L 29/0646; H01L 29/66136; H01L 2924/12036
See application file for complete search history.

(56) References Cited

U.S. PATENT DOCUMENTS

| | | | |
|---|---|---|---|
| 11,069,674 B2 * | 7/2021 | Willemen | ........... H01L 29/0649 |
| 2005/0214957 A1 | 9/2005 | Kihara et al. | |
| 2008/0191260 A1 | 8/2008 | De Vreede et al. | |
| 2008/0290465 A1 | 11/2008 | de Vreede | |
| 2009/0134960 A1 | 5/2009 | Larson et al. | |
| 2012/0169398 A1 | 7/2012 | Brindle et al. | |
| 2014/0167218 A1 | 6/2014 | Mallikarjunaswamy et al. | |
| 2015/0084162 A1 | 3/2015 | Davis | |
| 2015/0325573 A1 | 11/2015 | Wright et al. | |
| 2016/0329918 A1 | 11/2016 | Wright | |
| 2016/0351557 A1 | 12/2016 | Weyers | |
| 2018/0047718 A1 | 2/2018 | Yao et al. | |
| 2020/0051968 A1 | 2/2020 | Willemen | |
| 2021/0313311 A1 * | 10/2021 | Willemen | ............. H01L 29/408 |

* cited by examiner

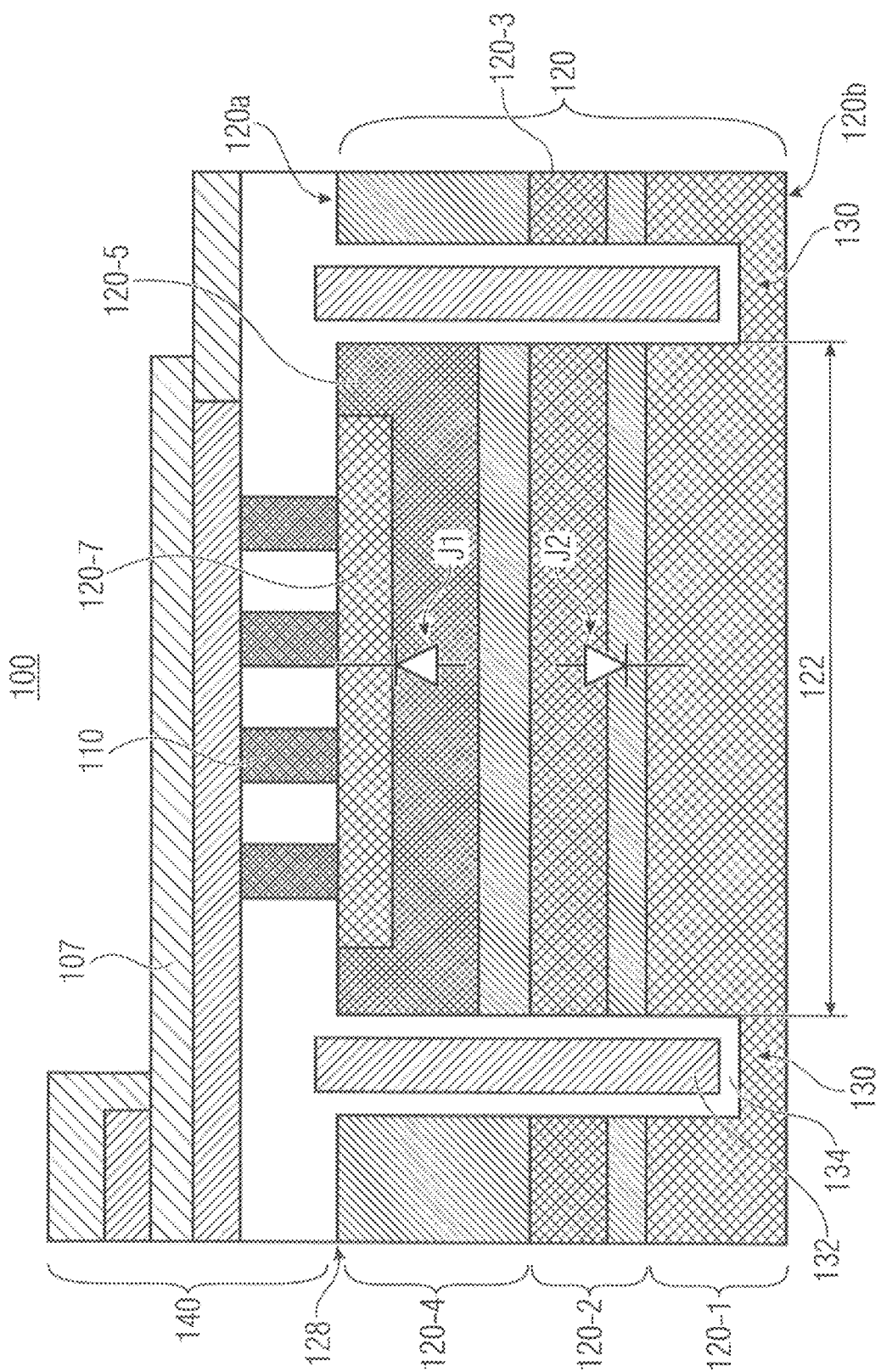

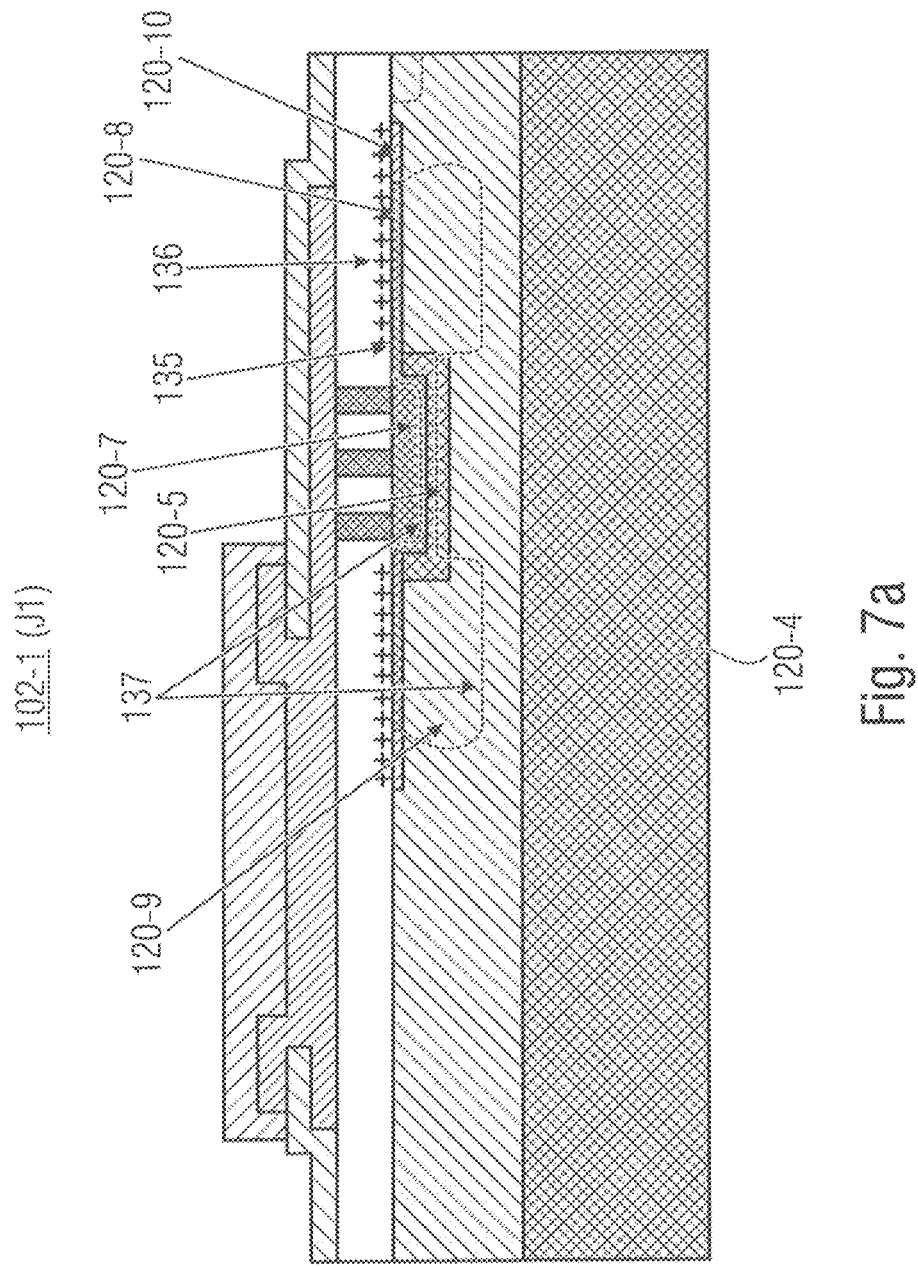

SEMICONDUCTOR DEVICE

This application is a continuation of U.S. patent application Ser. No. 16/538,211, filed Aug. 12, 2019, which application claims the benefit of German Application No. 102018213635.1, filed on Aug. 13, 2018, which applications are hereby incorporated herein by reference.

TECHNICAL FIELD

Embodiments relate to a semiconductor device comprising a composite pn-junction structure (also designated as a diode structure herein) in a semiconductor substrate, wherein the composite pn-junction structure is arranged to have a predetermined first junction grading coefficient $m_1$, for example, with $m_1 \geq 0.50$. The composite pn-junction structure comprises, for example, a first partial pn-junction structure and a second partial pn-junction structure. The first partial pn-junction structure is arranged, for example, to have a predetermined first partial junction grading coefficient $m_{11}$, and the second partial pn-junction structure is arranged, for example, to have a predetermined second partial junction grading coefficient $m_{12}$. The predetermined first partial junction grading coefficient $m_{11}$ is, for example, different to the predetermined second partial junction grading coefficient $m_{12}$, with $m_{11} \neq m_{12}$, and, for example, at least one of the predetermined first and second partial junction grading coefficients $m_{11}$, $m_{12}$ is greater than 0.50, with $m_{11}$ and/or $m_{12} > 0.50$. The predetermined first junction grading coefficient $m_1$ of the composite pn-junction structure (J1) is based, for example, on a predetermined combination of the first and second partial junction grading coefficients $m_{11}$, $m_{12}$.

Further embodiments relate to a semiconductor device having at least one composite pn-junction structure (also denoted diode structure herein) comprising an adjustable junction grading coefficient $m_1$ (preferably adjustable in design and technology, and typically not adjustable in operation), wherein the composite pn-junction structure comprises a first partial pn-junction structure and a second partial pn-junction structure, wherein each partial pn-junction structure may comprise an adjustable partial junction grading coefficient $m_{11}$, $m_{12}$ (also called diode power law exponent) (preferably adjustable in design and technology, and typically not adjustable in operation), the partial adjustable grading coefficients $m_{11}$, $m_{12}$.

BACKGROUND

Discrete ESD protection devices (ESD=electrostatic discharge) and TVS devices (TVS=transient voltage suppressor), in general, have non-linear electrical properties which cause a harmonic distortion of RF signals (RF=radio frequency) that are present on signal lines, e.g., on PCB lines (PCB=printed circuit board), that are connected to the ESD protection device or TVS device. This harmonic generation creates spurious and unwanted harmonic signals which may interfere with other functions or functional blocks of an electronic system if those functions or functional blocks use frequency bands that are an integer multiple of the distorted RF signal.

For example, the third harmonic (H3) frequency of certain frequency bands in the range between 800 and 900 MHz used in mobile telecommunication standards interferes with RF signals in the 2.4 GHz-WiFi-band, i.e., in the frequent range between 2.412 and 2.472 GHz.

To avoid such unwanted interferences between the above exemplarily described frequency bands, electronic devices, such as TVS devices, should minimize its harmonic generation to a sufficiently low level.

In known implementations, the generation of even harmonics is, for example, minimized by utilizing a strictly symmetrical design and a highly symmetric behavior of the electronic device for positive and negative half waves of the RF signal. By ensuring a symmetry, even harmonics can be efficiently suppressed, however, the generation of odd harmonics is not effected or supported by this approach.

Generally, there is a need in the art for an approach to implement semiconductor devices, e.g., for discrete ESD protection devices or TVS devices, having a reduced or minimum generation of odd harmonics, e.g., of the third harmonic further having an adjustable, for instance reduced or tuned breakdown voltage.

SUMMARY

According to an embodiment, a semiconductor device comprises a composite pn-junction structure in a semiconductor substrate, wherein the composite pn-junction structure is arranged to have a predetermined first junction grading coefficient $m_1$, with $m_1 \geq 0.50$, wherein the composite pn-junction structure comprises a first partial pn-junction structure and a second partial pn-junction structure, wherein the first partial pn-junction structure is arranged to have a predetermined first partial junction grading coefficient $m_{11}$, and wherein the second partial pn-junction structure is arranged to have a predetermined second partial junction grading coefficient $m_{12}$, wherein the predetermined first partial junction grading coefficient $m_{11}$ is different to the predetermined second partial junction grading coefficient $m_{12}$, with $m_{11} \neq m_{12}$, and wherein at least one of the predetermined first and second partial junction grading coefficients $m_{11}$, $m_{12}$ is greater than 0.50, with $m_{11}$ and/or $m_{12} > 0.50$, and wherein the predetermined effective first junction grading coefficient $m_1$ of the composite pn-junction structure is based on a predetermined combination of the first and second partial junction grading coefficients $m_{11}$, $m_{12}$.

BRIEF DESCRIPTION OF THE DRAWINGS

Embodiments of the present concept are described herein making reference to the appended drawings and figures, wherein:

FIG. 2a shows a schematic cross-sectional view of a semiconductor device according to an embodiment;

FIG. 2b shows a schematic simulated plot of an exemplary doping profile of pn-junction structures of the semiconductor device of FIG. 2a;

FIGS. 7a, 7b show further schematic cross-sectional views of different implementations of a semiconductor device having a composite pn-junction structure J1 according to a further embodiment.

DETAILED DESCRIPTION OF ILLUSTRATIVE EMBODIMENTS

In the following description, embodiments of the invention are discussed in detail, however, it should be appreciated that the invention provides many applicable concepts that can be embodied in a wide variety of semiconductor devices. The specific embodiments discussed are merely illustrative of specific ways to make and use the invention, and do not limit the scope of the invention. In the following description of embodiments, the same or similar elements having the same function have associated therewith the same reference signs or the same name, and a description of the such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between," "adjacent" versus "directly adjacent," etc.).

Figure 1:
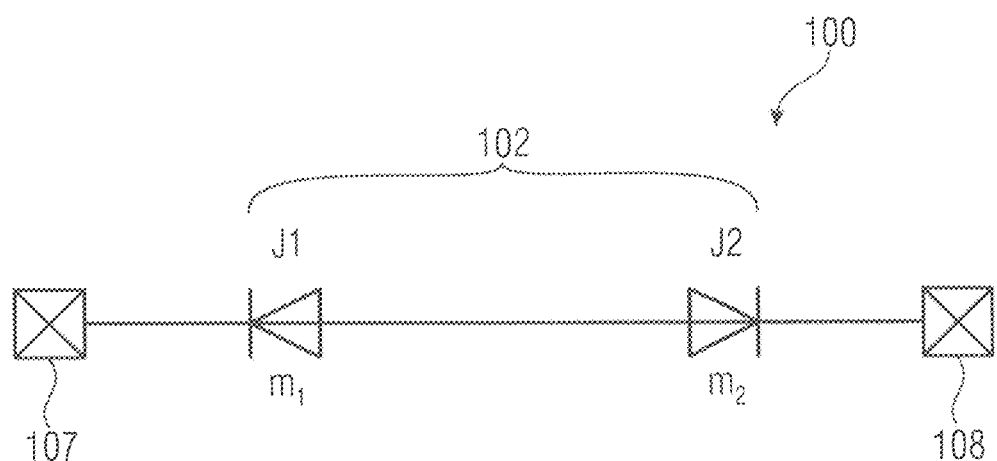
FIG. 1 shows an exemplary schematic circuit diagram of a semiconductor device consisting of a pair of anti-serially connected pn-junction structures according to an embodiment.

FIG. 1 shows a circuit diagram of a semiconductor device 100 that may be employed as ESD (electrostatic discharge) device. The semiconductor device 100 comprises a pair 102 of anti-serially connected pn-junction structures (diode structures) J1, J2, i.e., of a pn-junction structure J1 and a further pn-junction structure J2. The pn-junction structure J1 and the further pn-junction structure J2 are arranged to have a first effective junction grading coefficient $m_1$ and a second effective junction grading coefficient $m_2$, respectively. Additionally, the pn-junction structure J1 is arranged to have a first zero bias junction capacitance $C_{J01}$, and a first junction voltage potential $V_{J1}$, and the further pn-junction J2 structure is arranged to have a second bias junction capacitance $C_{J02}$, and a predetermined second junction voltage potential $V_{J2}$.

The pn-junction structures J1, J2 are connected between a first and a second terminal 107, 108.

In a commonly applied model of pn-junction structures, the i-th (i=1, 2) junction grading coefficient $m_i$ is determined based on a voltage dependent capacitance characteristic $C_i(V_i)$ of a depletion region of the pn-junction structure for a reverse bias voltage $V_i$ applicable to the pn-junction structure, with $$C_i(V_i) = \frac{C_{J0i}}{\left(\frac{V_i}{V_{Ji}}+1\right)^{m_i}}; \quad (A1)$$

The C(V) characteristics described by Equation A1 are also valid for small forward bias voltages. In other words, the expression is also valid for a range of applied voltages where the reverse bias voltage is negative, i.e., the applied voltage is a forward bias voltage. In this specification the wording "pn-junction (or diode structure) with a grading coefficient $m_i$" is used to express that the C(V) characteristics of the said pn-junction or diode structure can be described by equation A1 with grading coefficient or power law exponent $m_i$.

From the viewpoint of suppressing the generation of higher harmonics (e.g., second and third harmonics), for instance for use in simple topologies of an electronic RF signal switch device or a varactor diode or tuner diode or an ESD device, the pn-junction structures J1 and J2 may preferably be arranged to be equal and to have junction grading coefficients $m_1=m_2=0.50$. In other topologies, for instance of an ESD device, it may be preferential to have specifically adjusted but different zero bias capacitances $C_{J01}$, $C_{J02}$ of the anti-serially connected pn-junction structures J1, J2 and a junction grading coefficient being equal, with $m_1=m_2$ and $m_1>0.50$.

According to an embodiment, the semiconductor device 100 forms a discrete ESD device (ESD=electrostatic discharge) having a TVS functionality, for example. In other embodiments the device 100 forms an electronic RF signal switch device or a varactor diode or tuner diode.

Some examples for the grading coefficient m are:
- m=0.5 represents the behavior (1.) of an abrupt pn-junction with uniform dopants (=doping concentrations) in the n- and the p-region, or (2.) of a one-sided junction with a very abrupt pn-junction between a highly-doped region and a uniform doped lower-doped region. It may be difficult or expensive to realize this kind of idealized junction with the conventional semiconductor technologies.
- m=0.33 represents the behavior of a linearly-graded junction. In this case the dopant concentration around the metallurgical junction varies linearly with depth. This pn-junction type is very common with the conventional semiconductor technology as a result of diffusion of, for instance, a p-dopant species into a n-doped region.
- In the case of m=0.5 the term hyper-abrupt junction is used. It can be considered as a one-sided junction where the lower doped region does not have a constant doping profile but rather a doping concentration that decreases with distance from the metallurgical junction.

FIG. 2a shows a schematic cross-sectional view of the semiconductor device 100 as an example of a realization of the circuit diagram according to FIG. 1 in a semiconductor substrate 120.

As shown in FIG. 2a, the semiconductor device 100 comprises the semiconductor substrate 120 having a first main surface portion 120a and a second main surface portion 120b on opposing main sides of the semiconductor substrate 120.

The following exemplary description of the different layers and regions of the semiconductor substrate 120 essentially extends from the second main surface portion 120b to the first main surface portion 120a of the semiconductor substrate 120. The different regions and structures in the semiconductor substrate 120 may be manufactured, for example, during the so-called front end of line (FEOL) process stage of semiconductor integrated circuit fabrication.

The semiconductor substrate 120 may comprise a low ohmic n-type substrate 120-1. A p-type semiconductor layer 120-2 is arranged on the n-type substrate 120-1. The p-type semiconductor layer 120-2 (e.g., p-epi layer 120-2) may be epitaxially applied on the n-type substrate 120-1. The p-type semiconductor layer 120-2 comprises a buried p-type semiconductor layer 120-3 (P buried layer 120-3). The buried p-type semiconductor layer 120-3 may be formed e.g., in form of a blanket (unmasked) implantation of a p-type dopant in the semiconductor layer 120-2.

A further p-type layer 120-4 (e.g., p-epi layer 120-4) is arranged on the p-type semiconductor layer 120-2 with the buried p-type layer 120-3. The p-type semiconductor layer 120-4 may be epitaxially applied on the p-type semiconductor layer 120-2. Alternatively, layer 120-4 may also be realized by an i-type (i.e., intrinsic or not intentionally doped) layer.

In the second epitaxial layer 120-4, a p-type well region 120-5 (p-well 120-5) may be arranged. The p-type well region 120-5 may be formed after having conducted a LOCOS oxidation of the main surface area 120a of the p-type layer 120-4 of the semiconductor substrate 120 and by conducting a blanket implantation step. Based on this approach, no lithographical resist mask would be necessary on the surface area 120a of the p-type layer 120-4, but a self-aligned implantation process could be conducted due to the LOCOS oxidation on the surface 120a. A LOCOS process (LOCOS=LOCal OXidation of Silicon) is a microfabrication process where silicon dioxide is formed in selected areas on a silicon wafer, i.e., the semiconductor substrate 120, having the $S_i$-$Sio_2$ interface at a lower point or plane than the rest of the silicon main surface area 120a. Of course p-well 102-5 may also be formed by employing lithographic structurized photo resist mask methods generally known in the art.

As shown in FIG. 2a, the pn-junction structures J1 and J2 may be arranged in a semiconductor area 122 of the semiconductor substrate 120, which may be separated from other areas of the semiconductor substrate 120 by means of so-called deep isolation trenches 130 which laterally confine and/or laterally surround the semiconductor area 122 with the pn-junction structures J1, J2. The deep isolation trenches 130 may be formed for example by means of RIE process steps (RIE=reactive ion etching) in the semiconductor substrate 120, wherein the achieved trenches 130 may be lined with an oxide material 134, e.g., a $S_iO_2$ liner, by means of a trench liner oxidation process and filled by means of a semiconductor material 132, e.g., poly-silicon.

The semiconductor device 100 further comprises highly doped n-type contact regions 120-7 in the form of implantation regions adjacent to the surface area of the p-type well 120-5. N-type contact region 120-7 may also be regarded simply as a shallow n-region 120-7 or as an emitter region in some embodiments. The n-type contact regions 120-7 may be formed by means of an n-contact implantation process step, e.g., by means of a blanket implantation, which may be self-aligned by means of the (above described) LOCOS process so that no lithographical resist mask is necessary.

As a further (e.g., final) process step of the front end of line process for processing the semiconductor substrate 120, an oxide material 128 may be deposited on the first main surface area 120a of the semiconductor substrate 120. The semiconductor device 100 may further comprise a contact and metallization layer stack 140 (BEOL stack, BEOL=back end of line) on the first main surface area 120a of the semiconductor substrate 120 for providing interconnections 100 (for example contact plugs or vias) and interconnect layers 107. The terminal 108 (not shown in FIG. 2a but in FIG. 1) may be formed by a backside metallization of the semiconductor substrate 120 or on another area of the semiconductor substrate 120. The contact structures and (structured) metallization layers of the metallization stack 140 may be formed by means of BEOL process steps. Finally, one or more of the semiconductor devices 100 may be separated (diced), if a plurality of semiconductor devices 100 are fabricated in the semiconductor substrate 120, such as a semiconductor wafer 120. For example, a chip scale packaging process comprising, for instance, the formation of electrodes (or pads) as the top layer of the metallization stack 140 and a dicing process.

As shown in FIG. 2a, the n-type contact region 120-7 (=cathode region) and the p-type well region 120-5 (=anode region) form the pn-junction structure J1. Moreover, the buried p-type layer 120-3 (=anode region) and the n-type substrate 120-1 (=cathode region) form the further pn-junction structure J2.

Figure 2B:
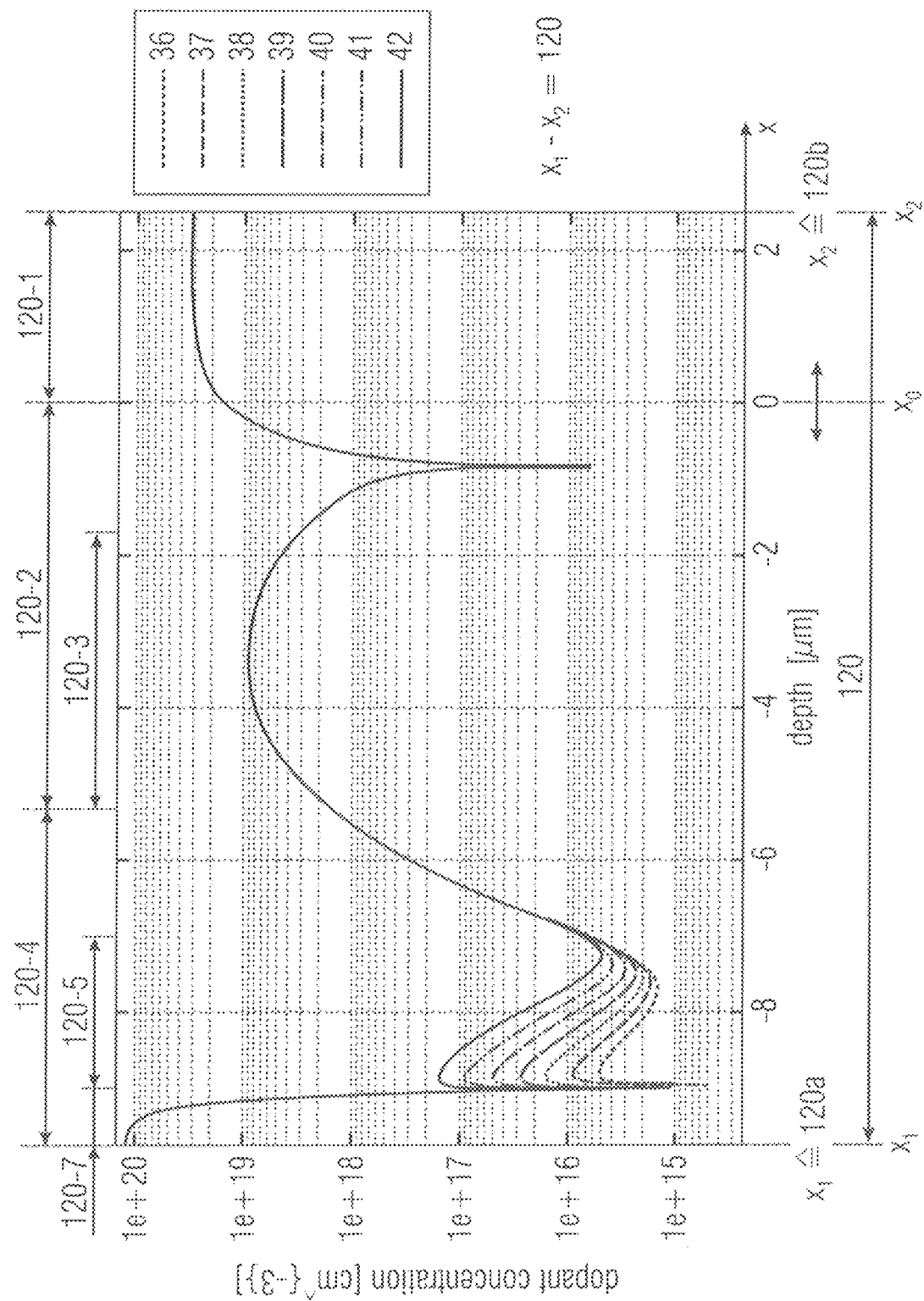

FIG. 2b shows a schematic calculated plot of an exemplary doping profile of the semiconductor device 100 of FIG. 2a, wherein different doping concentrations in the p-type well 120-5 may be achieved by different implantation doses, which are indicated with "36" to "42". The plot of FIG. 2b further contains an exemplary indication of the approximate extension of the different layers and/or regions of the of the semiconductor substrate 120 of FIG. 2a. The metallurgical junction between n-type region 120-7 and p-type region 120-5 falls in the declining slope of the p-type implantation profile of region 120-5. With a sufficiently steep slope of the n-type implantation of n-type region 120-7, the C(V) properties of the pn-junction formed by regions 120-5 and 120-7 may represent hyper-abrupt character and thus may have a grading coefficient $m_1 > 50$.

As may be appreciated from the further analysis of the various doping profiles shown in FIGS. 2a and 2b, in the conventional semiconductor technologies, there is a difficulty to realize (hyper-)abrupt junctions with low breakdown voltages below 25 V or even below 16 V or 12 V with a controllable grading coefficient $m \geq 0.5$. This is due to the fact that conventionally used processing steps in semiconductor technology, such as implantation and diffusion, yield dopant profiles that show some grading in a narrow region around the metallurgical junction. The space-charge region, which determines the capacitance vs. voltage behavior and the breakdown voltage of a pn-junction, is extending around the metallurgical junction. In case of a low breakdown voltage the doping concentrations are high and the extent of the space charge region is small. With increasing breakdown voltage the doping concentration at one or both sides of the metallurgic junction is decreasing and the width of the space charge region is increasing. Due to the inevitable grading near the metallurgical junction, a junction with a low breakdown voltage will in practice see a more or less graded profile, instead of the desired abrupt or hyper-abrupt doping profile. Therefore the combination of low breakdown voltage and a grading coefficient m≥0.5 is difficult to be realized with semiconductor processes that are conventionally used in mass production of semiconductor devices and circuits.

To summarize, higher doping levels lead to a less extended space charge region (=depletion region) and, thus, to a low(er) breakdown voltage $V_{bd}$. Moreover, a resulting more linear graded junction behavior leads to a small(er) gradient coefficient m.

A high(er) grading coefficient m≥0.5 requires a more (or hyper) abrupt doping profile. In case of a lower doping level at one side of metallurgical junction the depletion layer will extend further into this lower doped region. Therefore, the depletion layer is not restricted to a narrow region around the metallurgical junction as in the case of higher doping levels, in which usually the doping profile is showing a more or less linear grading. Because the depletion region extends beyond this graded region close to the metallurgical junction in case of a lower doping level, the C(V) characteristics of the lower doped junction can more easily be adapted to a grading coefficient m≥0.5. At the same time a low(er) doping level leads to a higher breakdown voltage $V_{bd}$.

Therefore, the combination of low breakdown voltage and a grading coefficient m≥0.5 is difficult to realize with the conventional technology.

Figure 3A:
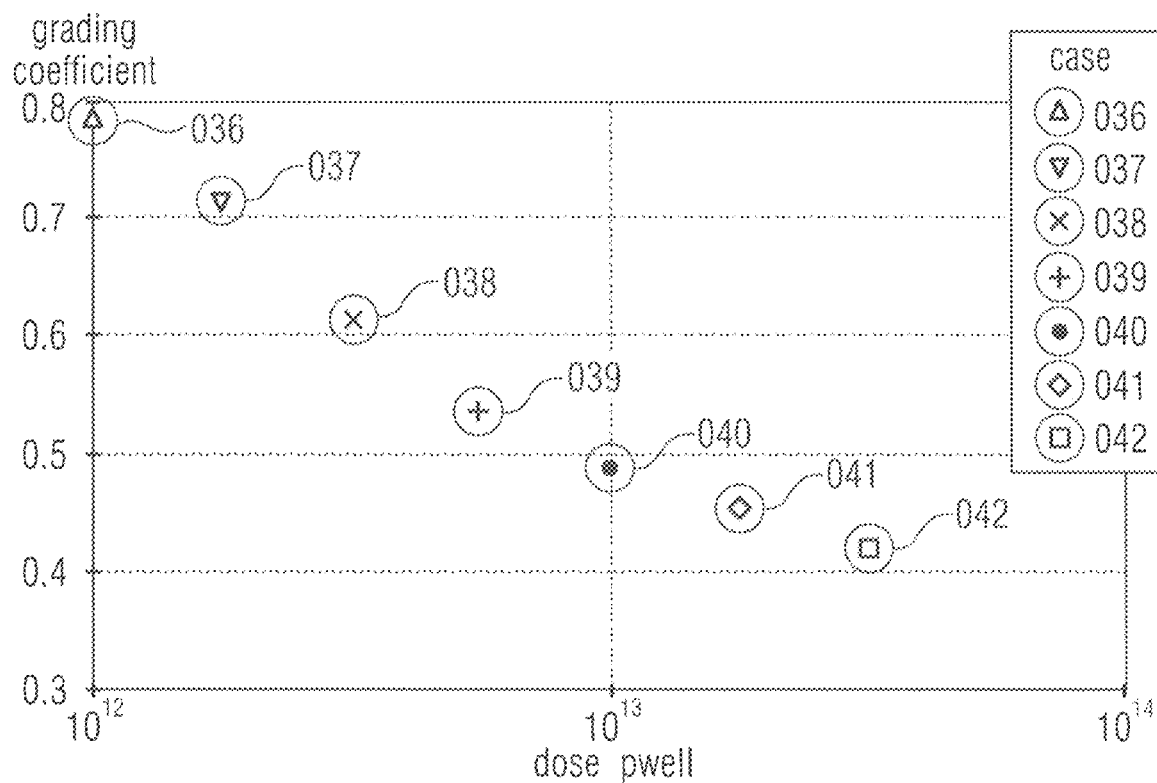
FIG. 3a shows a schematic simulated plot of the resulting junction grading coefficient $m_1$ as a function of the doping concentration based on different implantation doses for the shallow pn-junction of the doping profiles of FIG. 2b.

FIG. 3a shows a schematic plot of the resulting simulated junction grading coefficient $m_1$ as a function of the doping concentration based on different implantation doses of the portion of the doping profile of FIG. 2b in region 120-4 which comprises the pn-junction between region 120-7 and 120-5. To be more specific, the simulated Capacitance vs. Voltage characteristics of the pn-junction between a highly n-doped shallow contact region and the p-doped well region are shown in FIG. 3a for the doping profiles shown in FIG. 2b (described in more detail above) for semiconductor region 120-4 comprising regions 120-7 and 120-5 (cf. e.g., FIG. 2a), wherein equal numbers (36-42) denote corresponding doping profiles. From this figure, it can be seen that with low implantation doses for the p-well hyper-abrupt junctions with m>0.5 can be obtained.

Figure 3B:
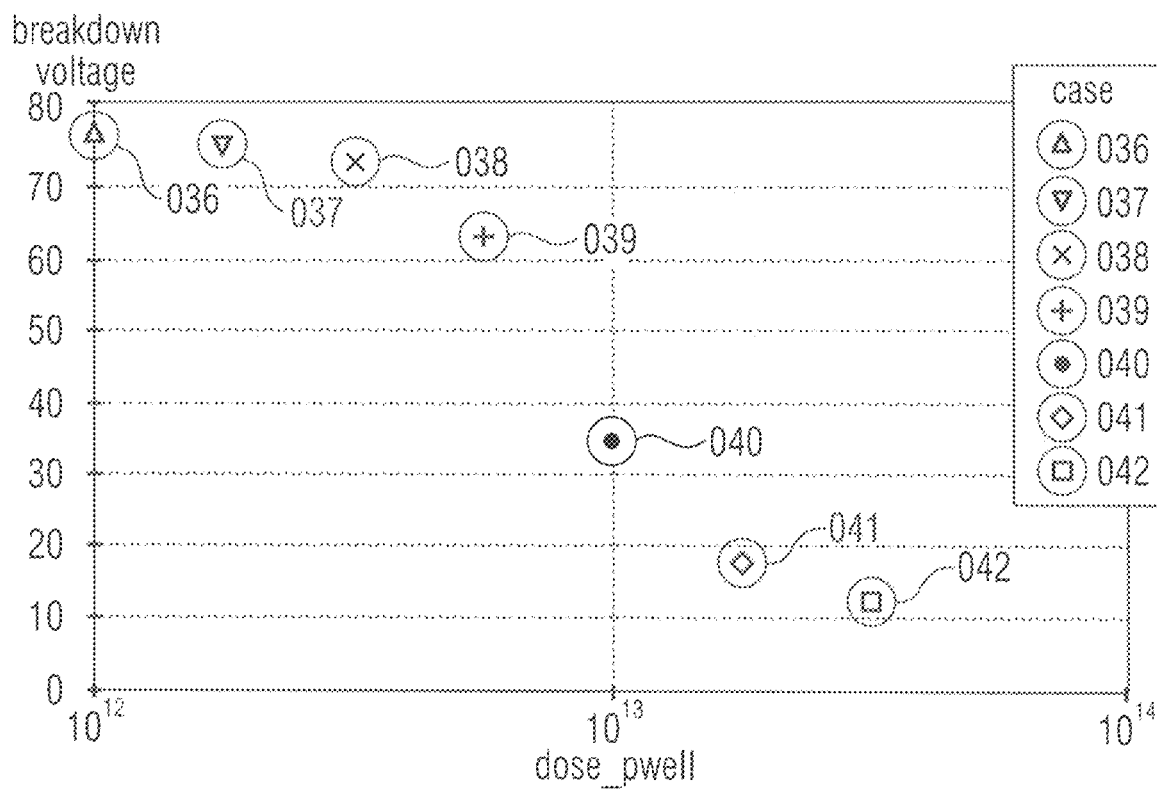
FIG. 3b shows a schematic simulated plot of the resulting breakdown voltage as a function of the doping concentration based on different implantation doses for the shallow pn-junction of the doping profiles of FIG. 2b.

FIG. 3b shows a schematic plot of the resulting simulated breakdown voltage of the pn-junction between region 120-7 and 120-5 as a function of the doping concentration based on different implantation doses and doping profiles as indicated by the same numbers as in FIGS. 3a and 2b. However, as discussed above, the junction with the lower p-well doses, which tend to have the highest grading coefficients, tends to have high breakdown voltages, as shown in FIG. 3b. In the case of this simulation example it is shown that, if for minimum 3rd harmonic generation a grading coefficient about 0.5 is required, the junction would have a breakdown voltage of 40 V or higher without using a composite pn-junction structure as explained above.

Some embodiments provide the semiconductor device 100 with both desired properties, i.e., a low breakdown voltage and adjustable gradient coefficient of at least 0.50.

According to embodiments, which will be described in more detail with reference to FIG. 4 below, a semiconductor device 100 may be provided, the semiconductor device 100 comprising a composite pn-junction structure 102-1 in a semiconductor substrate 120, wherein the composite pn-junction structure 102-1 may be arranged to have a predetermined first junction grading coefficient $m_1$, with $m_1 \geq 0.50$. The composite pn-junction structure 102-1 may comprise a first partial pn-junction structure J11 and a second partial pn-junction structure J12. The first partial pn-junction structure J11 may be arranged to have a predetermined first partial junction grading coefficient $m_{11}$. The second partial pn-junction structure J12 may be arranged to have a predetermined second partial junction grading coefficient $m_{12}$. The predetermined first partial junction grading coefficient $m_{11}$ may be different to the predetermined second partial junction grading coefficient $m_{12}$, with $m_{11} \neq m_{12}$. At least one of the predetermined first and second partial junction grading coefficients $m_{11}$, $m_{12}$ may be greater than 0.50, with $m_{11}$ and/or $m_{12} > 0.50$ Furthermore, the predetermined first junction grading coefficient $m_1$ of the composite pn-junction structure 102-1 may be based on a predetermined combination of the first and second partial junction grading coefficients $m_{11}$, $m_{12}$.

According to further embodiments, which will also be described in more detail with reference to FIG. 4 below, a semiconductor device 100 may be provided, the semiconductor device 100 comprising a further composite pn-junction structure 102-2 in the semiconductor substrate 120. The composite pn-junction structure 102-1 and the further composite pn-junction structure 102-2 may be monolithically integrated. In other words, the composite pn-junction structure 102-1 and the further composite pn-junction structure 102-2 may be integrated within the same semiconductor substrate 120. Alternatively, the composite pn-junction structure 102-1 and the further composite pn-junction structure 102-2 may not be monolithically integrated but formed as separate discrete components. In other words, alternative embodiments may also be implemented by electrically connecting separate chips having the composite pn-junction structure 102-1 and the further composite pn-junction structure 102-2 respectively for instance using bond wires or any other technology. The further composite pn-junction structure 102-2 may be arranged to have a predetermined second junction grading coefficient $m_2$, with $m_2 \geq 0.50$. The further composite pn-junction structure 102-2 may comprise a further first partial pn-junction structure J21 and a further second partial pn-junction structure J22. The further first partial pn-junction structure J21 may be arranged to have a predetermined further first partial junction grading coefficient $m_{21}$, and the further second partial pn-junction structure J22 may be arranged to have a predetermined further second partial junction grading coefficient $m_{22}$. The predetermined further first partial junction grading coefficient $m_{21}$ may be different to the predetermined further second partial junction grading coefficient $m_{22}$, with $m_{21} \neq m_{22}$. At least one of the predetermined further first and second partial junction grading coefficients $m_{21}$, $m_{22}$ may be greater than 0.50, with $m_{21}$ and/or $m_{22} > 0.50$. Furthermore, the predetermined second junction grading coefficient $m_2$ of the further composite pn-junction structure 102-2 may be based on a predetermined combination of the predetermined further first and second partial junction grading coefficients $m_{21}$, $m_{22}$.

Figure 4:
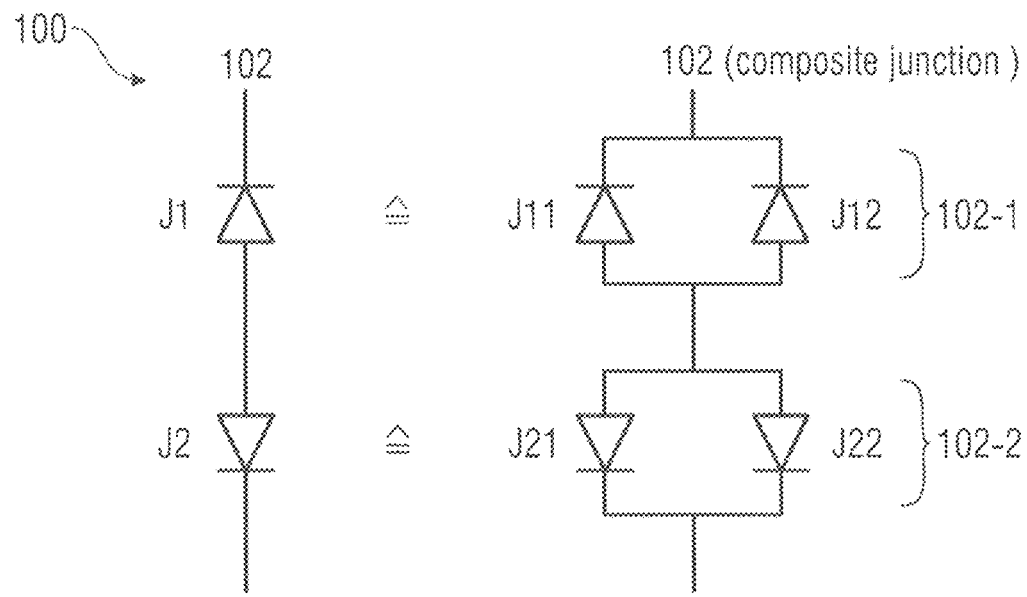
FIG. 4 shows schematic equivalent circuit diagrams according to an embodiment, wherein a composite pn-junction structure J1 is equivalent with a first and a second partial pn-junction structure J11, J12, and wherein a further compo-site pn-junction structure J2 is equivalent with a further first and a further second partial pn-junction structure J21, J22.

FIG. 4 shows an example of a pair 102 of pn-junction structures which is formed as a pair of two composite pn-junction structures 102-1, 102-2. The first composite pn-junction structure 102-1 may occasionally also be referenced with reference sign J1, and the second composite pn-junction structure 102-2 may occasionally also be referenced with reference sign J2. The first composite pn-junction structure 102-1 comprises a first partial pn-junction structure J11 and a second partial pn-junction structure J12, and the second composite pn-junction structure 102-2 (also referred to as a further pn-junction structure) comprises a further first partial pn-junction structure J21 and a further second partial pn-junction structure J22. That is to say the pair 102 is formed by a pair of anti-serially connected composite pn-junction structures 102-1, 102-2 each of which has parallel connection of a first partial pn-junction structure J11, J21 and a second partial pn-junction structure J12, J22. The first partial pn-junction structure J11 of the first composite pn-junction structure 102-1 has a first partial junction grading coefficient $m_{11}$, a first partial junction voltage potential $V_{J11}$ and a first partial zero bias capacitance $C_{J011}$, wherein the second partial pn-junction structure J12 of the first composite pn-junction structure 102-1 has a second partial junction grading coefficient $m_{12}$, a second partial junction voltage potential $V_{J12}$ and a second partial zero bias capacitance $C_{J012}$, which can be different to at least one of the first partial junction grading coefficient $m_{12}$, the first partial junction voltage potential $V_{J11}$ and the first partial zero bias capacitance $C_{J011}$ for example. Based on a combination of the first and second partial junction grading coefficients $m_{11}$, $m_{12}$, a first effective junction grading coefficient $m_1$ of the composite pn-junction structure 102-1 results. That is to say the composite pn-junction structure 102-1 behaves as pn-junction structure having an effective junction grading coefficient $m_1$, an effective junction potential $V_{J1}$, and an effective zero bias junction capacitance $C_{J01}$. This effective behavior of the composite pn-junction structure 102-1 as a simple pn-junction structure is indicated in FIG. 4 by the correspondence of the composite pn-junction structure 102-1 to the pn-junction structure J1. Correspondingly, the voltage dependent capacitance characteristics of the composite pn-junction structure J1 can, in many cases, be satisfactorily described or modeled by the expression A1 above, taking mi as the effective (combined) junction grading coefficient and similarly for the junction potential $V_{Ji}$ and the zero bias junction capacitance $C_{J0i}$. Additionally, for the further composite pn-junction structure 102-2, the further first partial pn-junction structure J21 has a first partial junction grading coefficient $m_{21}$, a further first partial junction voltage potential $V_{J21}$ and a further first partial zero bias capacitance $C_{J021}$, wherein the further second partial pn-junction structure J22 has a further second partial junction grading coefficient $m_{22}$, a further second partial junction voltage potential $V_{J22}$ and a further second partial zero bias capacitance $C_{J022}$, which can be different to at least one of the further first partial junction grading coefficient $m_{21}$, the further first partial junction voltage potential $V_{J21}$ and the further first partial zero bias capacitance $C_{J021}$ for example. Based on a combination of the further first and further second partial junction grading coefficients $m_{21}$, $m_{22}$, a second effective junction grading coefficient $m_2$ of the further composite pn-junction structure 102-2 results. That is to say the further composite pn-junction structure 102-2 behaves as pn-junction structures having an effective junction grading coefficient $m_2$, an effective junction potential $V_{J2}$, and an effective zero bias junction capacitance $C_{J02}$. As for the composite pn-junction structure 102-1 his effective behavior of the further composite pn-junction structure 102-2 as a simple pn-junction structure is indicated in FIG. 4 by the correspondence of the further composite pn-junction structure 102-2 to the further pn-junction structure J2. Correspondingly, the voltage dependent capacitance characteristics of the composite pn-junction structure J2 can, in many cases, be satisfactorily described or modeled by the expression A1 above, taking $m_i$ as the effective (combined) junction grading coefficient and similarly for the junction potential $V_{Ji}$ and the zero bias junction capacitance $C_{J0i}$.

In other words, the semiconductor device 100 as shown in FIG. 4 according to an embodiment comprises a first parallel circuit 102-1 of the first partial pn-junction structure J11 and the second partial pn-junction structure J12, and a second parallel circuit 102-2 of the further first partial pn-junction structure J21 and the further second partial pn-junction structure J22, wherein the first and second parallel circuits 102-1, 102-2 are anti-serially connected. The anti-serially connected first and second parallel circuits 102-1, 102-2 form the pair 102 of the pn-junction structures J1, J2 shown in FIGS. 1 and 4.

As can be appreciated from the above including specifically FIG. 4, the semiconductor device 100 with the resulting junction grading coefficients $m_1$, $m_2$ of the pn-junction structures can be realized with a large degree of freedom. In particular, a pn-junction structure with a large freedom of tuning the breakdown voltage with a grading coefficient $m \geq 0.5$ can be realized as a composite pn-junction structure and used for the semiconductor device 100 of some embodiments or may be employed singly in a variety of different topologies in other embodiments.

In other words the embodiments, as shown in FIG. 4 introduce a concept to obtain a junction (pn-junction structure) with both desired properties, i.e., a predetermined low breakdown voltage of not more than 25 V and predetermined grading coefficient equal to or above 0.5 by subdividing the junction into two areas, i.e., into partial pn-junction structures J11, J12; J21, J22 that together form a respective composite pn-junction structure 102-1, 102-2:

(1) one active area with a higher well implantation dose, which results in a part of the pn-junction J11, J21 with a low predetermined breakdown voltage, where in some embodiments the pn-junctions J11, J21 may have a grading coefficient $m_{11}<0.50$, $m_{21}<0.50$, and (2) another active area with a lower well implant dose, which results in a part of the pn-junction J12, J22 with a breakdown voltage higher than the predetermined one and a grading coefficient $m_{12}>0.50$, $m_{22}>0.50$.

The overall behavior of this composite pn-junctions 102-1 and 102-2, respectively, shows a breakdown voltage that is determined by the higher well doping, and the grading coefficient of the capacitance-vs-voltage characteristics is determined by the parallel connection in the two branches of the first and second partial pn-junction structures J11, J12 and J21, J22, respectively.

By adjusting (1) the grading coefficients $m_{11}$, $m_{12}$ (and $m_{21}$, $m_{22}$) in the two regions of the first and second partial pn-junction structures J11, J12 (and J21, J22) (by well implantation dose and energy, as well by further diffusion steps) and by adjusting (2) the area ratio of the two regions of the first and second partial pn-junction structures J11, J12 (and J21, J22) with different well implantation, the resulting effective grading coefficient $m_1$ of the resulting composite junction structure 102-1 (and $m_2$ of 102-2) can be adjusted.

In some embodiments, for the pair 102 of the composite junctions 102-1 and 102-2 a zero bias capacitance ($C_{j0}$) of J11 and J21 (as well as of J12 and J22, respectively) may be arranged to be equal from the perspective of forming a symmetric device 100 for suppressing also generation of even (e.g., $2^{nd}$) harmonics. Similar considerations hold for the junction voltage potentials ($V_{j0}$) of the partial pn-junction structures J11 and J21 (as well as J12 and J22, respectively) as well as for the area ratios of the partial pn-junctions in each of the composite structures 102-1 and 102-2 forming the pair 102 of composite pn-junction structures. In these embodiments, it may be further advantageous from the viewpoint of suppressing the generation of spurious odd harmonics (e.g., third harmonics) to adjust the effective grading coefficients $m_1$ and $m_2$ to $m_1 = m_2 = 0.50$. In other embodiments, for suppression of the generation of spurious odd harmonics to adjust the effective grading coefficients to $m_1 = m_2 > 0.50$.

In the concept described above a pair of composite pn-junctions 102-1 and 102-2 is realized in which the breakdown voltage and the net grading coefficient can be both controlled in a much larger parameter range by technology and physical design or layout adjustments.

Figure 5:
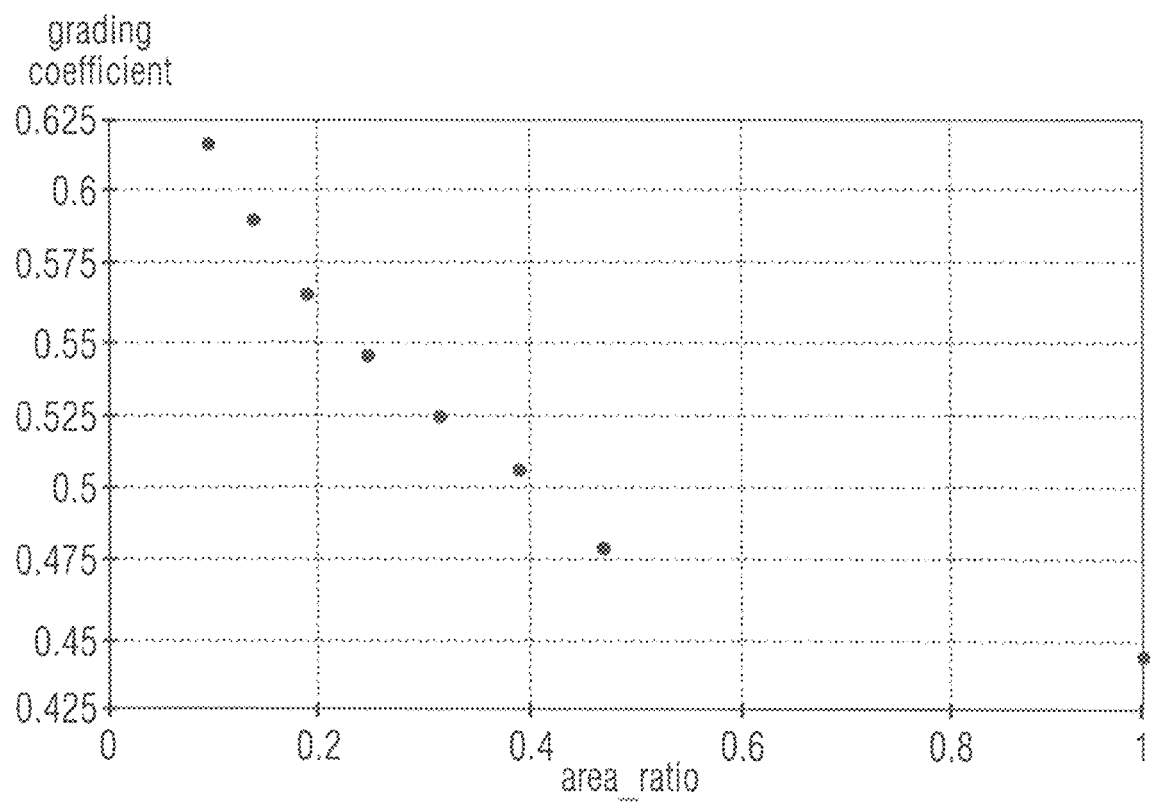
FIG. 5 shows the resulting combined junction grading coefficient of the composite pn-junction structure as a function of the area ratio between the areas of the first and second partial pn-junction structures based on two adjusted partial junction grading coefficients $m_{11}$, $m_{12}$ for two of the doping profiles shown in FIG. 2b.

FIG. 5 shows the resulting, combined junction grading coefficient $m_1$ (or $m_2$) of the composite pn-junction structure 102-1 (or 102-2) as a function of the area ratio between the active areas of the first and second partial pn-junction structures J11 and J12 (or J21 and J22) of the composite pn-junction structure 102-1 (102-2) based on two adjusted partial junction grading coefficients $m_{11}$ (or $m_{21}$) and $m_{12}$ (or $m_{22}$). The doping profiles of the first and second partial pn-junction structure in this case correspond to numbers 37 and 41 shown in FIG. 2b (see also respective numbers in FIGS. 3a and 3b). As discussed above the breakdown voltage of the junction with the lowest p-well doses and highest grading coefficients tend to have high breakdown voltages, as shown in the FIG. 5. The relative area contribution can be easily controlled by the physical design (layout) of the device.

According to an embodiment, the first partial pn-junction structure J11 is arranged to have a first partial junction grading coefficient $m_{11} > 0.50$, and wherein the second partial pn-junction structure J12 is arranged to have a second partial junction grading coefficient $m_{12} < m_{11}$, e.g., $m_{11}$ may be between 0.30 and 0.50.

According to an embodiment, the first and second partial pn-junction structures J11, J21, and J12, J22 are arranged in a semiconductor substrate 120, wherein said combination proportionately depends on an area ratio between an active area parallel to a first main surface area 120a of the semiconductor substrate 120 of the first and second partial pn-junction structures J11 and J12 of the composite pn-junction structure 102-1 as well as J21 and J22 of the further composite pn-junction structure 102-2. According to an embodiment, the first and second partial pn-junction structures J11, J12 of the composite pn-junction structure 102-1 and the first and second partial pn-junction structures J21, J22 of the further composite pn-junction structure 102-2 may be arranged together in a laterally isolated common region of the semiconductor substrate 120. According to an embodiment, the first and second partial pn-junction structures J11, J12; J21, J22 vertically extend in a depth direction with respect to a first main surface area 120a of the semiconductor substrate 120 into the semiconductor substrate 120.

Thus, embodiments relate to a semiconductor device 100 having a "composite" pn-junction structure J1 (102-1) having at least two partial pn-junction structures J11, J12, to adjust and obtain a desired behavior regarding its breakdown voltage and/or junction grading coefficient.

Figure 6A:
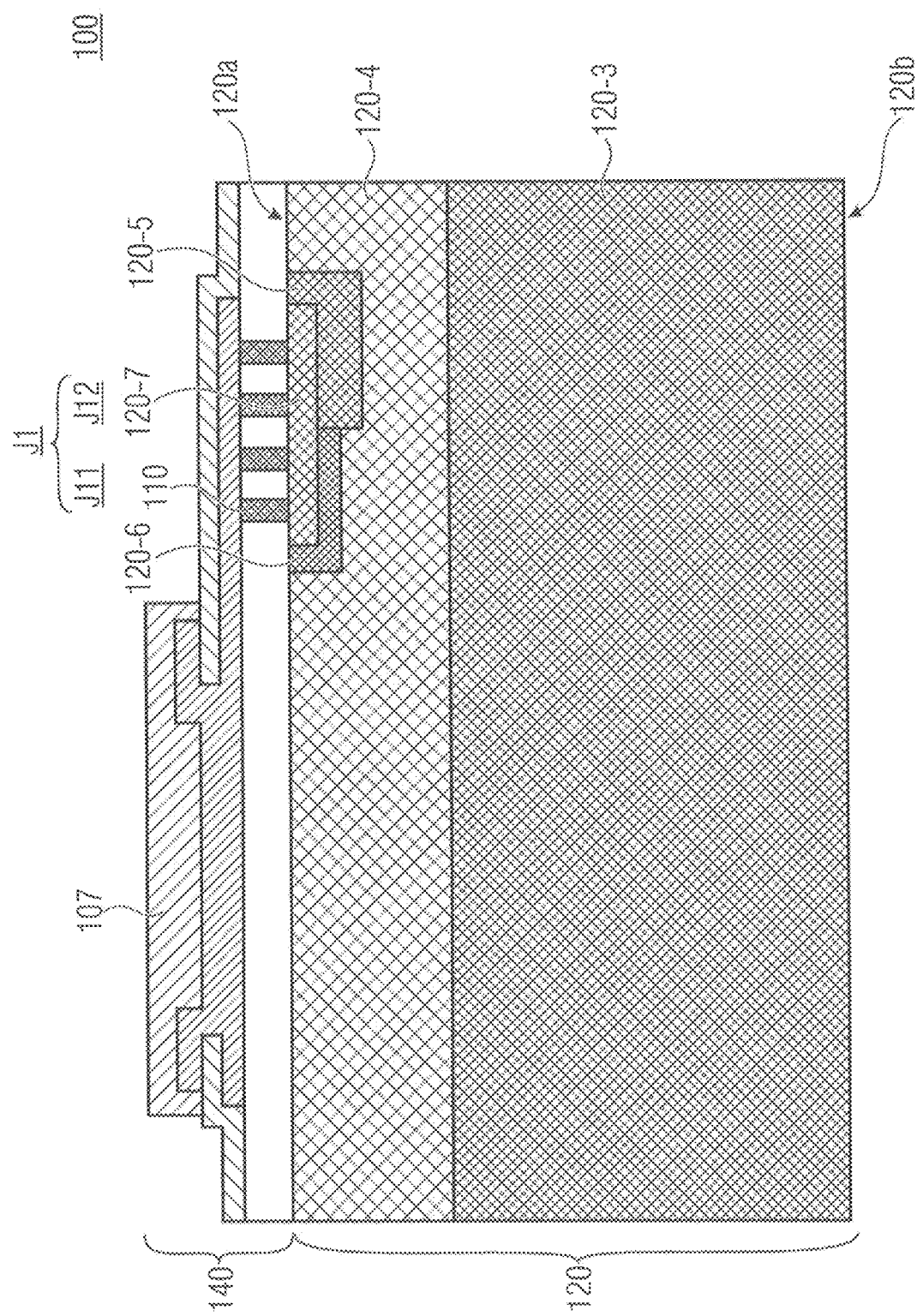
FIGS. 6a-6d show schematic cross-sectional views of different implementations of a semiconductor device having a composite pn-junction structure J1 according to an embodiment.

According to an embodiment, the semiconductor device 100 as shown in FIG. 6a comprises a composite pn-junction structure J1 (102-1) in a semiconductor substrate 120, wherein the composite pn-junction structure J1 is arranged to have a predetermined first junction grading coefficient $m_1$, with $m_1 \geq 0.5$, wherein the composite pn-junction structure J1 comprises a first partial pn-junction structure J11 and a second partial pn-junction structure J12.

The first partial pn-junction structure J11 is arranged to have a predetermined first partial junction grading coefficient $m_{11}$, wherein the second partial pn-junction structure J12 is arranged to have a predetermined second partial junction grading coefficient $m_{12}$. The predetermined first partial junction grading coefficient $m_{11}$ is different to the predetermined second partial junction grading coefficient $m_{12}$, with $m_{11} \neq m_{12}$, wherein at least one of the predetermined first and second partial junction grading coefficients $m_{11}$, $m_{12}$ is greater than 0.5, with $m_{11}$ and/or $m_{12} > 0.5$. The predetermined first junction grading coefficient $m_1$ of the composite pn-junction structure J1 is based on a predetermined combination of the first and second partial junction grading coefficients $m_{11}$, $m_{12}$.

FIG. 6a shows a schematic cross-sectional view of a semiconductor device 100 having the "composite" pn-junction (diode) structure J1 as shown in FIG. 4. As shown in FIG. 6a, the semiconductor device 100 comprises the semiconductor substrate 120 having a first main surface portion 120a and a second main surface portion 120b on opposing main sides of the semiconductor substrate 120.

The following exemplary description of the different layers and regions of the semiconductor substrate 120 essentially extends from the second main surface portion 120b to the first main surface portion 120a of the semiconductor substrate 120. The different regions and structures in the semiconductor substrate 120 are manufactured, for example, during the so-called front end of line (FEOL) process stage.

The semiconductor substrate 120 may comprise a p-type semiconductor layer 120-3 (P substrate 120-3). A further p-type layer 120-4 (e.g., P-epi layer) is arranged on the p-type layer 120-3. The p-type semiconductor layer 120-4 may be epitaxially applied on the p-type layer 120-3. In other embodiments the p-type layer 120-4 may be an integral portion of the p-substrate 120-3 and not an additional epitaxial layer. In other words, the epi layer described herein may be considered as optional.

In the epitaxial p-type layer 120-4, a p-type well region 120-5 (P-well 120-5) and a further p-type well region 120-6 (P-well 120-6) may be arranged. The semiconductor device 100 further comprises highly doped n-type contact regions 120-7 in the form of implantation regions adjacent to the surface area of the p-type wells 120-5, 120-6.

The semiconductor device 100 may further comprise a contact and metallization layer stack 140 (BEOL stack, BEOL=back end of line) on the first main surface area 120a of the semiconductor substrate 120 for providing interconnections 110 (for example contact plugs or vias) and contact regions 107 for the semiconductor device 100 and, optionally, for further circuit elements (not shown in FIG. 6a) in the semiconductor substrate 120. The contact structures and (structured) metallization layers of the metallization stack 140 may be formed by means of BEOL process steps. Finally, the semiconductor device 100 may be separated (diced), if a plurality of semiconductor devices 100 are fabricated in the semiconductor substrate 120, such as a semiconductor wafer 120. For example, a chip scale packaging process for pad deposition (formation of the electrodes) may be performed followed by a dicing process.

As shown in FIG. 6a, the first composite pn-junction structure J1 can be implemented by using two different implantation areas 120-5, 120-6 in the substrate region 120-4. Thus, the n-type contact region 120-7 in the substrate region 120-4 is embedded in the adjacent (=abutted) implantation areas 120-5, 120-6. The n-type contact region 120-7 in the substrate region 120-4 and the implantation area 120-6 form the first partial pn-junction structure J11, wherein the n-type contact region 120-7 in the substrate region 122 and the implantation area 120-5 form the second partial pn-junction structure J12 (as abutted partial pn-junction structures J11, J12 in this embodiment). The partial pn-junction structures of the second composite pn-junction structure J2 may be formed in a similar fashion as described for the first composite pn-junction structure J1 above.

Figure 6B:
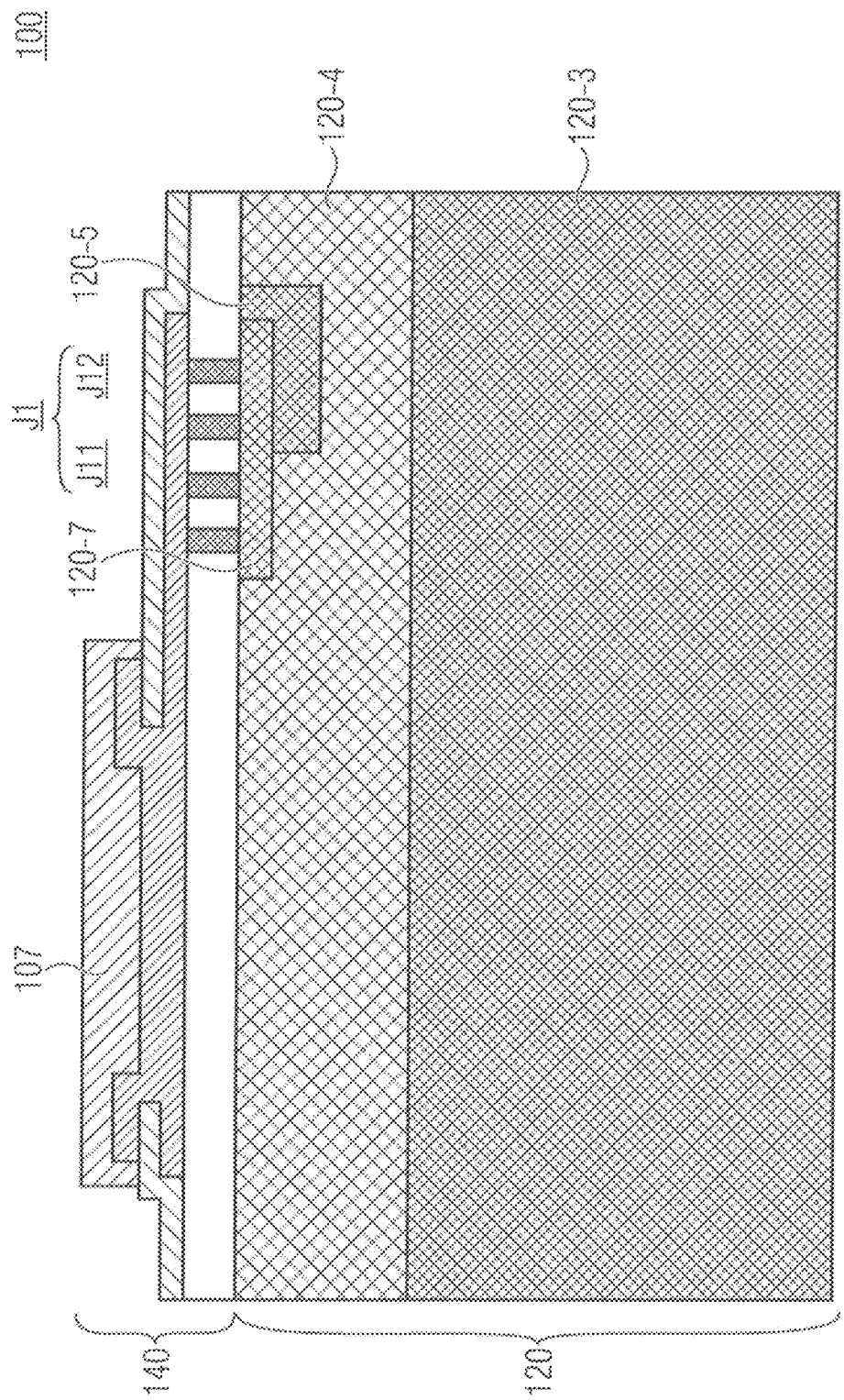

As shown in FIG. 6b, a p-type well region 120-5 (P-well 120-5) is arranged in the second epitaxial p-type layer 120-4 in the semiconductor regions 120-4, wherein the p-type well 120-5 only partially surrounds the highly doped n-type contact regions 120-7 in the p-type layer 120-4 of the semiconductor substrate 120. Thus, in the semiconductor region 120-4, the highly doped n-type contact regions 120-7 and the second epitaxial p-type layer 120-4 form the first partial pn-junction structure J11, wherein the p-type well region 120-5 and the highly doped n-type contact region 120-7 form the second partial pn-junction structure J12 (as abutted partial pn-junction structures J11, J12 in this embodiment). The p-type well region 120-5 (P-well 120-5) may, for example, be arranged in the epitaxial p-type layer 120-4 by forming the required doping profile in the p-type semiconductor layer 120-4, e.g., during epitaxially applying the p-type well region 120-5 on the p-type layer 120-3 or by performing an implantation step.

Alternatively, a doping profile in the layer 120-4 can be adjusted to obtain a predetermined grading coefficient $m_{12}$ in partial pn-junction structure J11, respectively, by gradually adjusting the doping level during epitaxial growth of the layer 120-4. In other words, a hyper abrupt junction behavior can be realized in partial pn-junction J11 by creating a depth dependence of the doping level in the epitaxial layer by means of controlling the gas flow of dopant source gas during epitaxial layer growth.

Figure 6C:
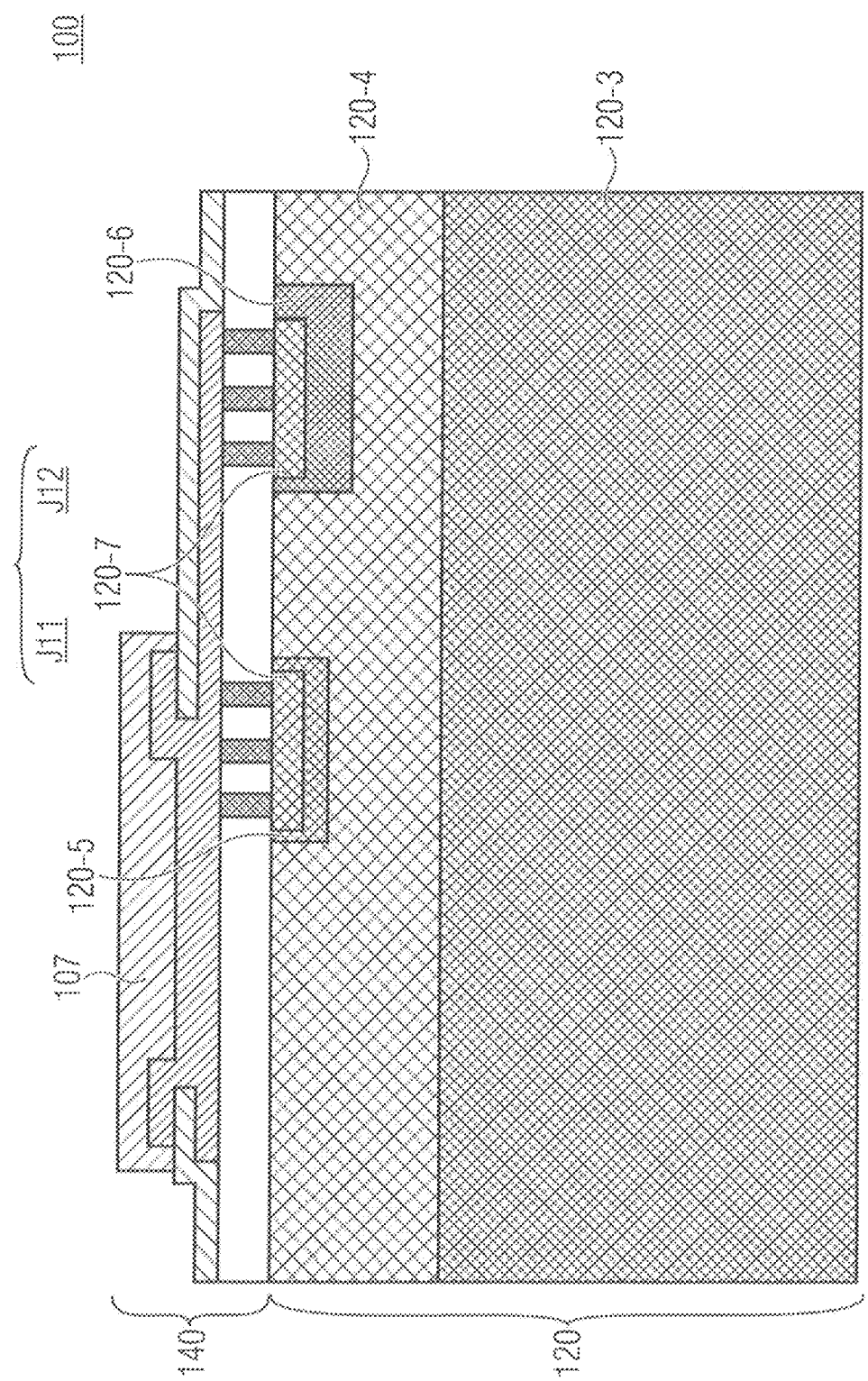

As shown in FIG. 6c, the first partial pn-junction structure J11 can be implemented by using the implantation area 120-5 in the substrate region 120-4, wherein the n-type contact region 120-7 is embedded in the implantation area 120-5. The second partial pn-junction structure J12, which is laterally spaced from the first partial pn-junction structure J11, can be implemented by using the implantation area 120-6 in the substrate region 120-4, wherein the further n-type contact region 120-7 is embedded in the implantation area 120-6. Thus, the partial pn-junction structures J11, J12 are non-abutted in this embodiment.

Figure 6D:
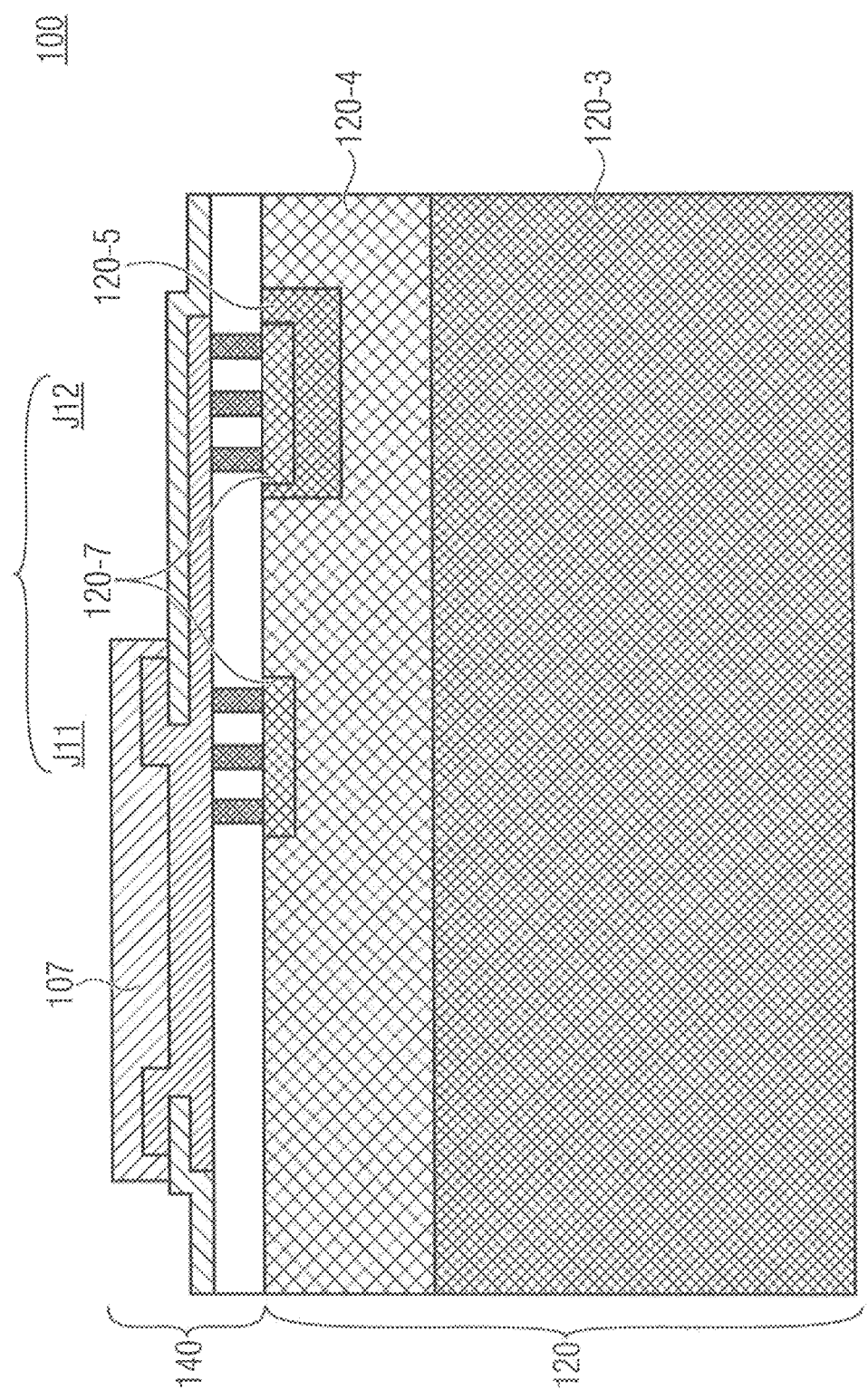

As shown in FIG. 6d, the highly doped n-type contact regions 120-7 and the second epitaxial p-type layer 120-4 form the first partial pn-junction structure J11, wherein the p-type well region 120-5 and the highly doped n-type contact region 120-7 form the second partial pn-junction structure J12, which is laterally spaced from the first partial pn-junction structure J11. Thus, the partial pn-junction structures J11, J12 are non-abutted in this embodiment.

Also in the case of FIG. 6d, alternatively, a doping profile in the layer 120-4 can be adjusted to obtain a predetermined grading coefficient $m_{12}$ in partial pn-junction structure J11, respectively, by gradually adjusting the doping level during epitaxial growth of the layer 120-4. In other words, a hyper abrupt junction behavior can be realized in partial pn-junction J11 by creating a depth dependence of the doping level in the epitaxial layer by means of controlling the gas flow of dopant source gas during epitaxial layer growth.

According to an embodiment, the partial pn-junction structure J11 or J12 of the first and second partial pn-junction structures J11, J12 having the smaller predetermined partial junction grading coefficient $m_{11}$ or $m_{12}$ is arranged to provide the predetermined breakdown voltage of the semiconductor device 100.

As described in detail above, higher doping levels lead to a less extended space charge region (=depletion region) and, thus, to a low(er) breakdown voltage $V_{bd}$. Moreover, a resulting more linear graded junction behavior leads to a small(er) grading coefficient. A high(er) grading coefficient requires a more hyper abrupt doping profile. However, due to the inability to create "ideal" abrupt profiles, a wide(r) space charge region with low(er) doping level results. A low(er) doping level leads to a higher breakdown voltage $V_{bd}$.

Thus, the required (e.g., low) breakdown voltage of the semiconductor device 100 is adjustable by the partial pn-junction structure J11 or J12 of the first and second partial pn-junction structures J11, J12 having the smaller predetermined partial junction grading coefficient $m_{11}$ or $m_{12}$.

According to an embodiment, the first partial pn-junction structure J11 is arranged to have a first partial junction grading coefficient $m_{11}$ greater than 0.50, with $m_{11} > 0.50$, and wherein the second partial pn-junction structure J12 is arranged to have a second partial junction grading coefficient $m_{12}$ greater than 0.25, with $m_{12} > 0.25$.

According to an embodiment, the first partial pn-junction structure J11 is arranged to have a first partial junction grading coefficient $m_{11}$ greater than 0.50, with $m_{11} > 0.50$, and wherein the second partial pn-junction structure J12 is arranged to have a second partial junction grading coefficient $m_{12}$ smaller than 0.50, with $m_{12} < 0.50$.

The predetermined first junction grading coefficient $m_1$ of the composite pn-junction structure J1 (102-1) is based on a predetermined combination of the first and second partial junction grading coefficients $m_{11}$, $m_{12}$. Thus, according to the present concept, the first partial pn-junction structure J11 with the first partial junction grading coefficient $m_{11}$ may be formed as a hyper-abrupt junction, wherein the second partial pn-junction structure J12 with the second partial junction grading coefficient $m_{12}$ may be formed as a linearly-graded junction ($m_{12} = 0.33 \neq 0.10$).

According to an embodiment, said predetermined combination of the first and second partial junction grading coefficients $m_{11}$, $m_{12}$ proportionately depends on an area ratio between an active area 120-5, 120-6 parallel to a first main surface area 120a of the semiconductor substrate 120 of the first and second partial pn-junction structure J11, J12. Thus, the resulting predetermined first junction grading coefficient $m_1$ may be adjusted by the circuit design, i.e., by adjusting the ratio of the active areas of the first and second partial pn-junction structure J11, J12.

According to an embodiment, the first and second partial pn-junction structures J11, J12 of the composite pn-junction structure J1 (102-1) are electrically connected in parallel, as shown in FIGS. 6a to 6d. Moreover, the first and second partial pn-junction structures J11, J12 may vertically extend in a depth direction with respect to a first main surface area 120a of the semiconductor substrate 120 into the semiconductor substrate 120.

A person skilled in the art will appreciate that in all the above embodiments in the boundary region of the pn-junctions between 120-7 and 120-4, 120-5, 120-6 may have different electrical characteristics than the planar junction formed between 120-7 and 120-4, 120-5, 120-6, such as a reduced breakdown voltage in the peripheral region in comparison to the breakdown voltage in the planar junction, which is parallel to the main surface 120a, and a person skilled in the art will appreciate that additional features may optionally be added in any of the embodiments described herein to avoid unwanted properties in the peripheral region, which may include guard ring implantations, edge termination structures, or adjusting the overlap or underlap of region 120-7 with respect to 120-4, 120-5, 120-6.

It should be noted that the composite junction does not necessarily need to be determined by different p-wells (for example, as shown in FIGS. 6a to 6d). Rather, as an alternative, it is, for example, also possible to implement two pn-junctions circuited in parallel and comprising different (partial) junction grading coefficients using a p-well (or a single p-well) and two different contact implantations (e.g., 120-7). For example, a less steep N-profile (or N-doping profile) can be achieved using a phosphorus doping, and a more steep profile (or N-doping profile) can be achieved using an arsenic doping. Thus, such a less steep profile comprising a phosphorus doping and a more steep profile comprising an arsenic doping would result in two different (partial) junction grading coefficients when introduced into a p-well (or into a single or common p-well). The steepness of the n-profile is also adjustable by an application of different annealing steps to the one profile (of the two profiles) and to the other profile (of the two profiles).

To conclude, it is not necessary to have different p-wells or different p regions for the implementation of two pn-junctions circuited in parallel and comprising different (partial) junction grading coefficients. Rather, a common p-well or two p-wells having identical doping could also be used, wherein different (partial) junction grading coefficients can be achieved by adapting doping profiles of n-doped regions. Such an adaptation can optionally be applied to the embodiments as shown in FIGS. 6a to 6d, and also to the other embodiments disclosed herein.

FIG. 7a shows a configuration of a composite pn-junction structure 102-1 according to another embodiment. The composite pn-junction structure 102-1 comprises a pn-junction between an n+ region 120-7 and a p-well region 120-5 and another adjoining voltage dependent capacitance, which—in this embodiment—may be formed by an inversion charge layer 120-8 at the semiconductor/oxide interface 135 and a bulk or epi-layer 120-4 of semiconductor material. The bulk semiconductor material or epi layer 120-4 may be p-doped or intrinsic (i.e. not intentionally doped) for example. One electrode (corresponding to the cathode) of this voltage dependent capacitance is formed by the inversion charge layer 120-8 which is caused by the presence of fixed oxide charges 136 at or near the semiconductor/oxide interface 135. Directly adjoining the inversion charge layer 120-8, the volume of semiconductor material is depleted of mobile charges as indicated by depletion region 120-9 in FIG. 7a and the un-depleted semiconductor material below the depleted zone forms the other electrode (corresponding to the anode) of the voltage dependent capacitance. The depletion zone is indicated in FIG. 7a by means of dashed lines 137 schematically representing the boundaries of the depletion layer.

In some embodiments the doping profile of the p-well 120-5 near the edges and the semiconductor/oxide interfaces 135 is adjusted so that also in this region an inversion charge layer 120-8 is present and an electrical connection between the n+ region 120-7 and the surrounding inversion charge layer 120-8 is established.

The characteristics of the voltage depending capacitance formed due to the electron inversion charge layer 120-8 may be modeled according to formula (A1) above which defines a grading coefficient, a zero bias capacitance and junction potential also for this kind of voltage dependent capacitance. In this respect, the voltage dependent capacitance formed due to the presence of the inversion charge layer 120-8 as described above is also considered a partial pn-junction structure J11, J12; J21, J22 in the context of the composite pn-junction structure J1 (102-1), J2 (102-2).

The effective grading coefficient of the composite pn-junction structure 102-1 according to this embodiment is a combination of the grading coefficient of the pn-junction and the grading coefficient of the voltage dependent capacitance formed due to the presence of the electron inversion charge layer 120-8. The relative contribution of both grading coefficients can be adjusted by (1) the doping profiles of the respective regions defining the pn-junction and the voltage dependent capacitance 120-8, and (2) the relative areas of the pn-junction and the voltage dependent capacitance 120-8.

The voltage dependent capacitance 120-8 may be surrounded by a channel stop region 120-10 which avoids that regions outside the intended region, where the voltage dependent capacitance 120-8 is formed, contribute to the voltage dependent capacitance.

The breakdown voltage $V_{bd}$ of such a structure is determined by the pn-junction structure between the n+ region 120-7 and the p-well region 120-5.

Figure 7B:
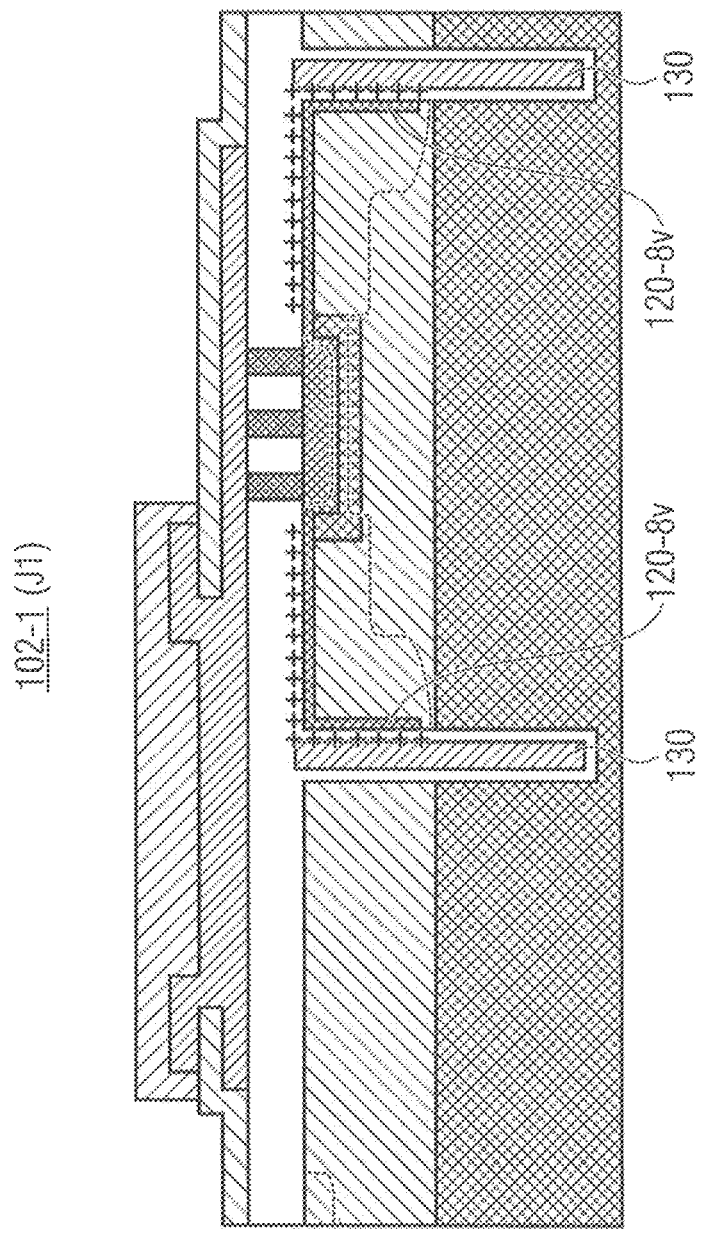

FIG. 7b shows yet another embodiment of the composite pn-junction structure 102-1. The voltage dependent capacitance of the embodiment shown in FIG. 7a is further extended by an inversion layer 120-8v which is formed on the vertical sidewalls of a deep isolation trench structure 130. The other specifics are similar to the ones described with respect to FIG. 7a and are not repeated here.

According to a further embodiment, examples of which may be discussed in detail below with reference to FIGS. 8a to 8d, the semiconductor device 100 further comprises a further (=second) composite pn-junction structure J2 in the semiconductor substrate 120, wherein the further composite pn-junction structure J2 is arranged to have a predetermined further first junction grading coefficient $m_2$, with $m_2 \geq 0.5$, wherein the further composite pn-junction structure J2 comprises a further first partial pn-junction structure J21 and a further second partial pn-junction structure J22, wherein the further first partial pn-junction structure J21 is arranged to have a predetermined further first partial junction grading coefficient $m_{21}$, and wherein the further second partial pn-junction structure J22 is arranged to have a predetermined further second partial junction grading coefficient $m_{22}$, wherein the predetermined further first partial junction grading coefficient $m_{21}$ is different to the predetermined further second partial junction grading coefficient $m_{22}$, with $m_{21} \neq m_{22}$, and wherein at least one of the predetermined further first and second partial junction grading coefficients $m_{21}$, $m_{22}$ is greater than 0.50, with $m_{21}$ and/or $m_{22} > 0.50$. The predetermined further first junction grading coefficient $m_2$ of the further composite pn-junction structure J2 is based on a predetermined combination of the predetermined further first and second partial junction grading coefficients $m_{21}$, $m_{22}$.

Thus, embodiments relate to a semiconductor device 100 having a first and a second composite pn-junction structure J1, J2, to adjust and obtain a desired TVS behavior (TVS=transient voltage suppressor) of the semiconductor device 100 regarding its breakdown voltage and junction grading coefficient (the latter for instance in respect of suppressing the generation spurious harmonics).

Figure 8A:
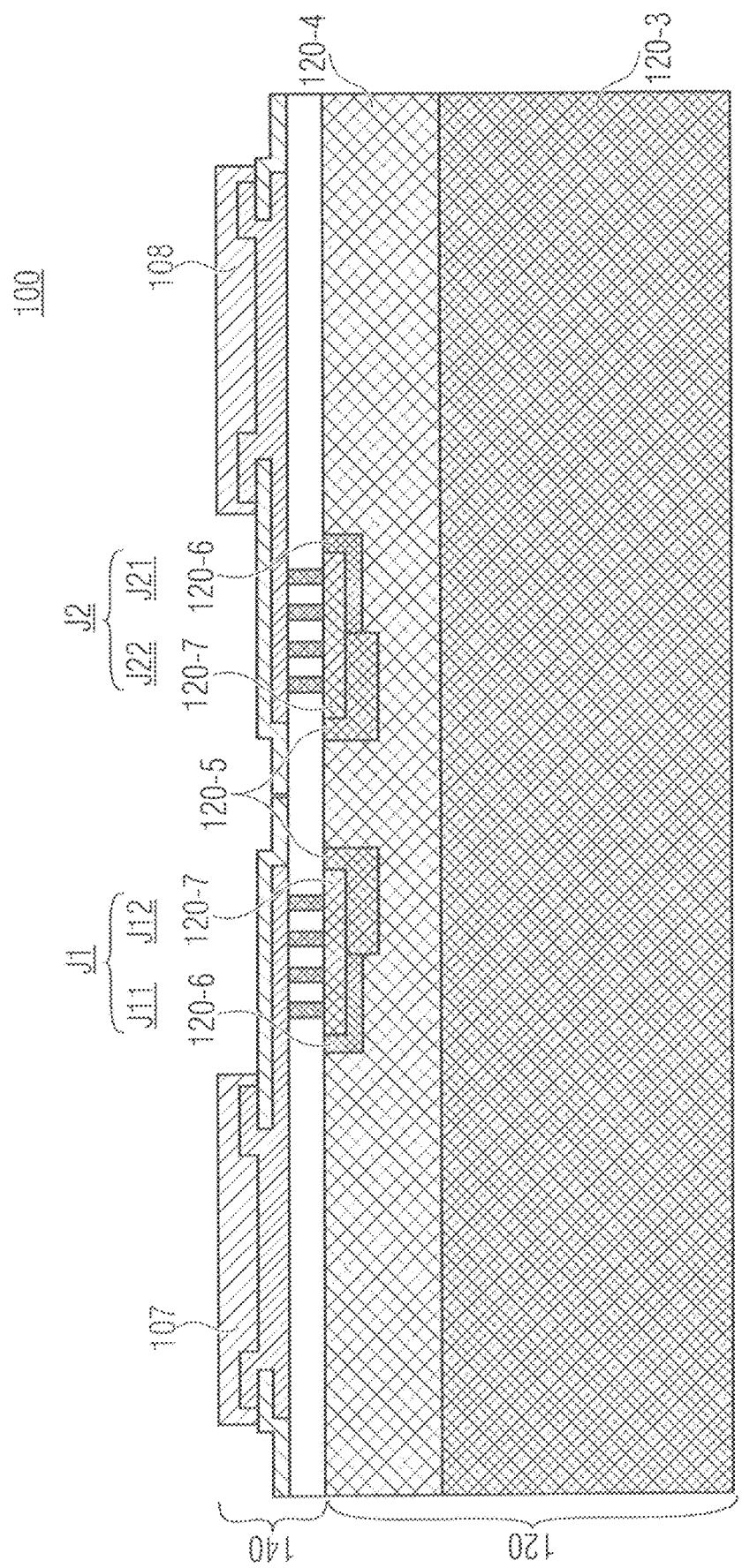
FIGS. 8a-8d show schematic cross-sectional views of different implementations of a semiconductor device having two composite pn-junction structures J1, J2 according to an embodiment.

As shown in FIG. 8a, the first composite pn-junction structure J1 can be implemented by using two different implantation areas 120-5, 120-6 in the substrate region 120-4, wherein the second composite pn-junction structure J2 can also be implemented by using two different implantation areas 120-5, 120-6 in the substrate region 120-4. Thus, the n-type contact regions 120-7 in the substrate region 120 are embedded in the adjacent implantation areas 120-5,

120-6. The n-type contact region 120-7 and the implantation area 120-6 form the first partial pn-junction structure J11, wherein the n-type contact region 120-7 and the implantation area 120-5 form the second partial pn-junction structure J12 (as abutted partial pn-junction structures J11, J12 in this embodiment). Moreover, the further n-type contact region 120-7 and the further implantation area 120-6 form the further first partial pn-junction structure J21, wherein the further n-type contact region 120-7 and the further implantation area 120-5 form the further second partial pn-junction structure J22 (as abutted partial pn-junction structures J21, J22 in this embodiment).

Figure 8B:
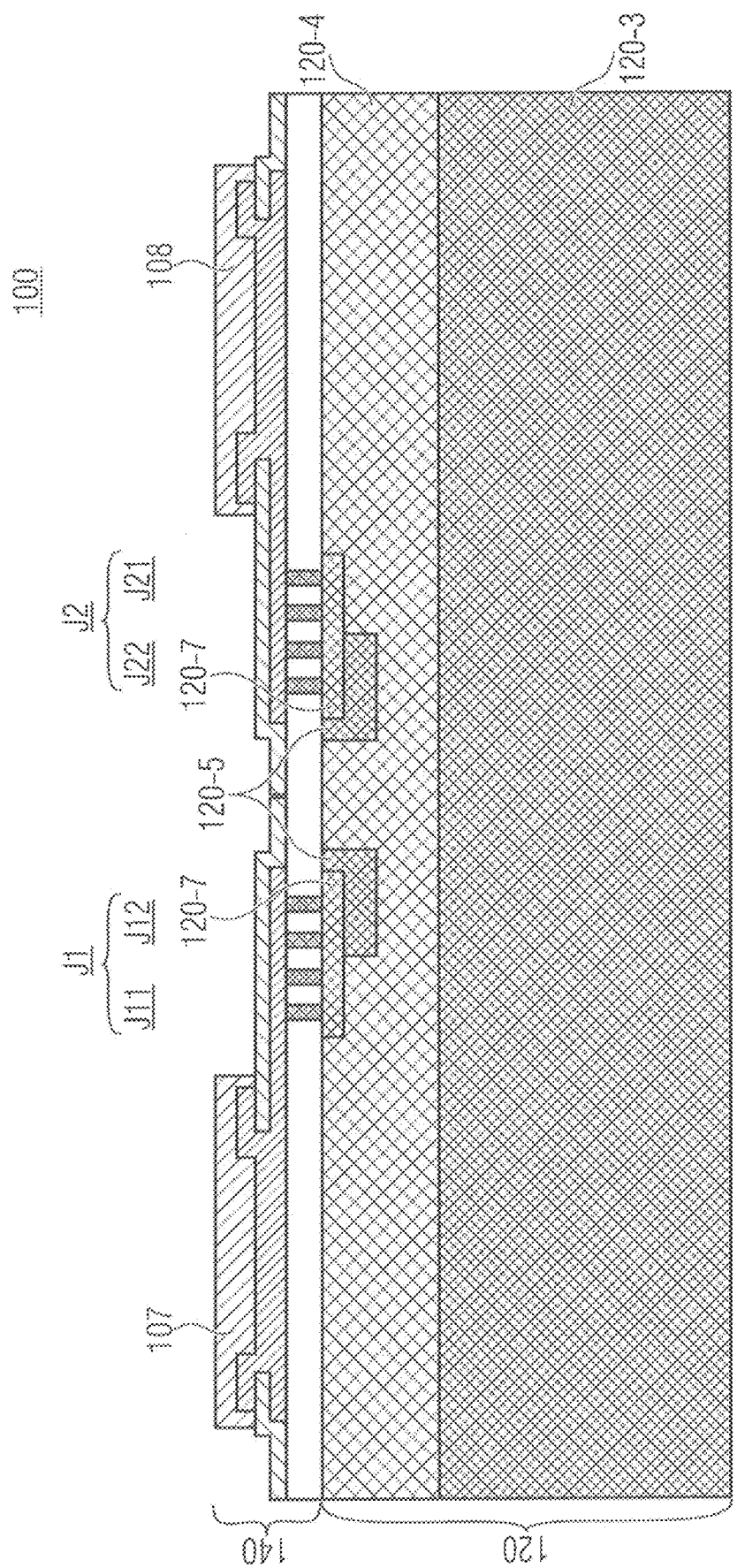

As shown in FIG. 8b, in the semiconductor region 120-4, the highly doped n-type contact regions 120-7 and the second epitaxial p-type layer 120-4 form the first partial pn-junction structure J11, J21, wherein the p-type well regions 120-5 and the highly doped n-type contact regions 120-7 form the second partial pn-junction structure J12, J22. Thus, in the semiconductor region 120-4, the highly doped n-type contact regions 120-7 and the epitaxial p-type layer 120-4 form the first partial pn-junction structure J11, wherein the p-type well region 120-5 and the highly doped n-type contact region 120-7 form the second partial pn-junction structure J12 (as abutted partial pn-junction structures J11, J12 in this embodiment). Further, in the semiconductor region 120-4, the further highly doped n-type contact regions 120-7 and the epitaxial p-type layer 120-4 form the further first partial pn-junction structure J21, wherein the further p-type well region 120-5 and the further highly doped n-type contact region 120-7 form the further second partial pn-junction structure J22 (as abutted partial pn-junction structures J21, J22 in this embodiment).

Figure 8C:
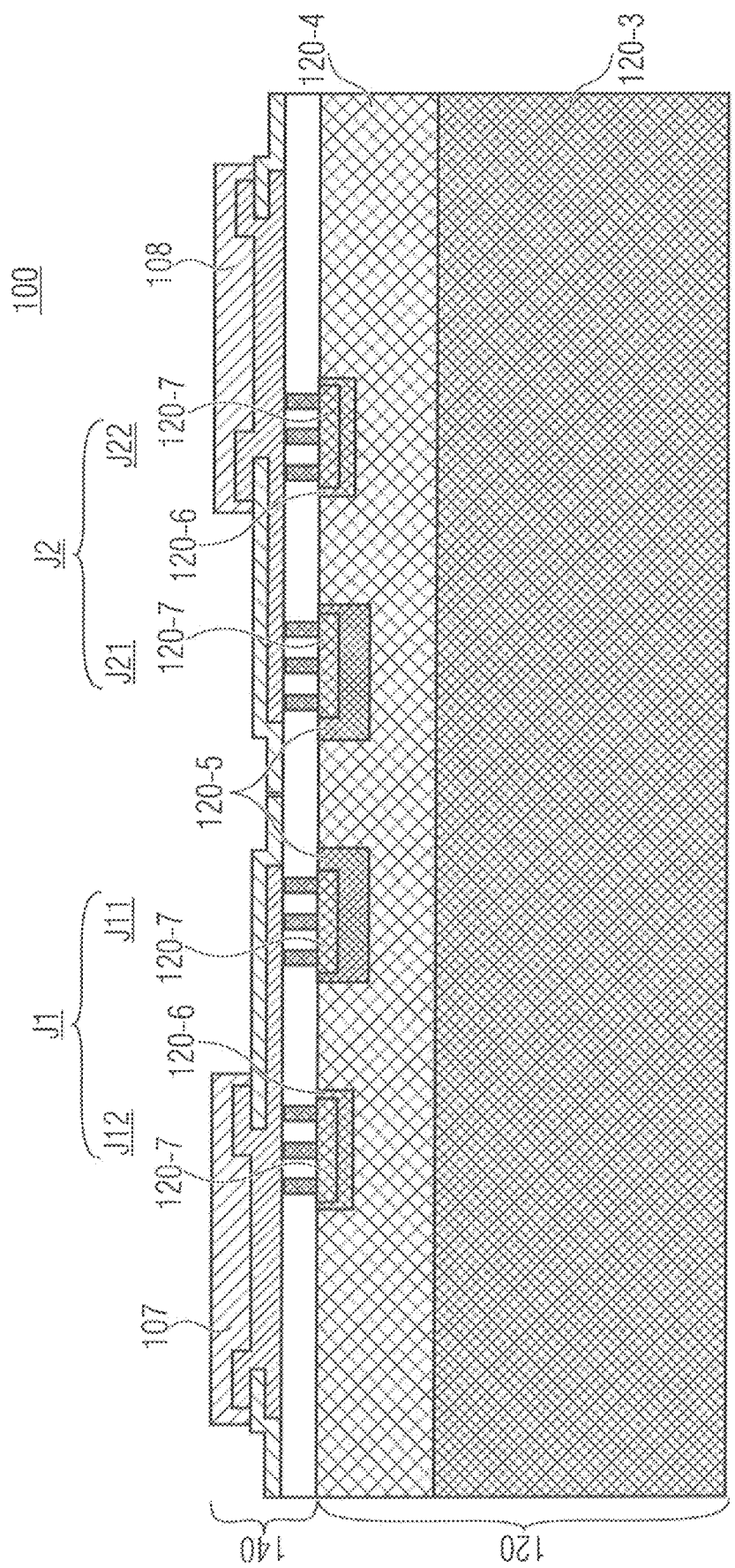

As shown in FIG. 8c, the respective first partial pn-junction structures J11, J21 can be implemented by using the implantation areas 120-5 in the substrate region 120-4, wherein the n-type contact regions 120-7 in the substrate region 120-4 are embedded in the implantation areas 120-5, respectively. The respective second partial pn-junction structures J12, J22 can be implemented by using the implantation areas 120-6 in the substrate region 120-4, wherein the further n-type contact regions 120-7 in the substrate region 120-4 are embedded in the implantation area 120-6.

To be more specific, the first partial pn-junction structure J11 of the first composite pn-junction structure J1 can be implemented by using the implantation area 120-5 in the substrate region 120-4, wherein the n-type contact region 120-7 is embedded in the implantation area 120-5. The second partial pn-junction structure J12 of the first composite pn-junction structure J1, which is laterally spaced from the first partial pn-junction structure J11, can be implemented by using the implantation area 120-6 in the substrate region 120-4, wherein the further n-type contact region 120-7 is embedded in the implantation area 120-6. Thus, the partial pn-junction structures J11, J12 of the first composite pn-junction structure J1 are non-abutted in this embodiment.

Furthermore, the further first partial pn-junction structure J21 of the further (i.e., second) composite pn-junction structure J2 can be implemented by using the further implantation area 120-5 in the substrate region 120-4, wherein the further n-type contact region 120-7 is embedded in the further implantation area 120-5. The further second partial pn-junction structure J22 of the further (i.e., second) composite pn-junction structure J2, which is laterally spaced from the further first partial pn-junction structure J21, can be implemented by using the further implantation area 120-6 in the substrate region 120-4, wherein the further n-type contact region 120-7 is embedded in the further implantation area 120-6. Thus, the partial pn-junction structures J21, J22 of the further (i.e., second) composite pn-junction structure J2 are non-abutted in this embodiment.

Figure 8D:
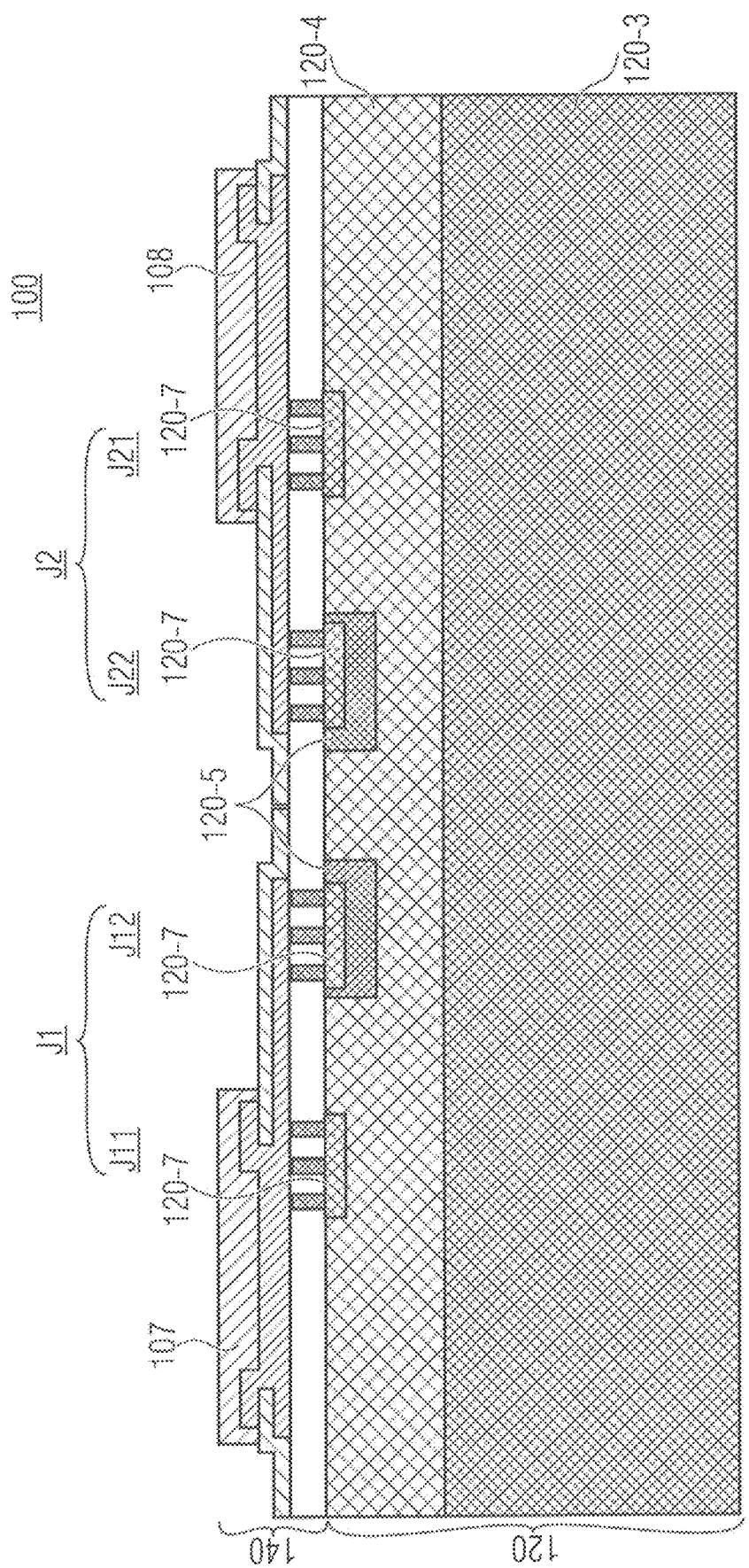

As shown in FIG. 8d, the highly doped n-type contact regions 120-7 and the epitaxial p-type layer 120-4 form the first partial pn-junction structure J11, J21, wherein the p-type well regions 120-5 and the further highly doped n-type contact regions 120-7 form the second partial pn-junction structure J12, J22.

To be more specific, the highly doped n-type contact regions 120-7 and the epitaxial p-type layer 120-4 form the first partial pn-junction structure J11 of the first composite pn-junction structure J1, wherein the p-type well region 120-5 and the highly doped n-type contact region 120-7 form the second partial pn-junction structure J12 of the first composite pn-junction structure J1, which is laterally spaced from the first partial pn-junction structure J11. Thus, the partial pn-junction structures J11, J12 are non-abutted in this embodiment.

Further, the further highly doped n-type contact regions 120-7 and the second epitaxial p-type layer 120-4 form the further first partial pn-junction structure J21 of the further (i.e., second) composite pn-junction structure J2, wherein the further p-type well region 120-5 and the further highly doped n-type contact region 120-7 form the further second partial pn-junction structure J22 of the further (i.e., second) composite pn-junction structure J2, which is laterally spaced from the further first partial pn-junction structure J21. Thus, the partial pn-junction structures J21, J22 are non-abutted in this embodiment.

According to an embodiment, the predetermined combination of the predetermined further first and second partial junction grading coefficients $m_{21}$, $m_{22}$ proportionately depends on an area ratio between an active area 120-5, 120-6 parallel to a first main surface area 120a of the semiconductor substrate 120 of the further first and second partial pn-junction structures J21, J22.

According to a further embodiment, the further first and second partial pn-junction structures J21, J22 of the further composite pn-junction structure J2 (102-2) may be electrically connected in parallel between the interconnect layer 140 and the semiconductor substrate 120.

According to a further embodiment, the further first and second partial pn-junction structures J21, J22 of the further composite pn-junction structure J2 (102-2) may vertically extend in a depth direction from a first main surface area 120a of the semiconductor substrate 120 into the semiconductor substrate 120.

According to a further embodiment, the composite pn-junction structure J1 (102-1) and the further composite pn-junction structure J2 (102-2) may be arranged to have substantially equal grading coefficients, with $m_1 = m_2$.

According to a further embodiment, the composite pn-junction structure J1 (102-1) may be arranged to have a predetermined first junction grading coefficient $m_1$, with $m_1 = 0.5$, a predetermined first zero-bias junction capacitance $C_{J01}$, and a predetermined first junction voltage potential $V_{J1}$, and wherein the further composite pn-junction structure J2 (102-2) may be arranged to have a predetermined second junction grading coefficient $m_2$, with $m_2 = 0.5$, a predetermined second zero-bias junction capacitance $C_{J02}$, and a predetermined second junction voltage potential $V_{J2}$, and wherein the predetermined first zero-bias junction capacitance $C_{J01}$ of the composite pn-junction structure J1 (102-1) and the predetermined second zero-bias junction capacitance $C_{J02}$ of the further composite pn-junction structure J2 (102-2) are substantially equal.

According to a further embodiment, the composite pn-junction structure J1 (102-1) is anti-serially connected to the further composite pn-junction structure J2 (102-2), wherein the first junction grading coefficient m1 and the second junction grading coefficient m2 are greater than 0.5, with $m_1$ and $m_2 > 0.5$ (hyper-abrupt).

According to a further embodiment, the composite pn-junction structure J1 (102-1) may be arranged to have a predetermined first zero-bias junction capacitance $C_{J01}$, and a predetermined first junction potential $V_{J1}$, and the further composite pn-junction structure J2 (102-2) may be arranged to have a predetermined second zero-bias junction capacitance $C_{J02}$, and a predetermined second junction voltage potential $V_2$, wherein the predetermined first zero-bias junction capacitance $C_{J01}$ of the composite pn-junction structure J1 (102-1) and the predetermined second zero-bias junction capacitance $C_{J02}$ of the further composite pn-junction structure J2 (102-2) may be substantially equal, and wherein the first junction grading coefficient $m_1$ and the second junction grading coefficient $m_2$ may be substantially equal.

According to an embodiment, the predetermined junction voltage potential $V_{J1}$ of the composite pn-junction structure J1 (102-1) and the predetermined second junction voltage potential $V_{J2}$ of the further composite pn-junction structure J2 (102-2) are substantially equal.

According to an embodiment, the semiconductor device forms an ESD protection device (ESD=electrostatic discharge).

With respect to FIGS. 8a to 8d embodiments were described having the composite pn-junction structure 102-1(J1) and the further composite pn-junction structure 102-2 (J2) integrated within the same semiconductor substrate 120. Of course the present invention is not limited to such a configuration and may also be implemented by electrically connecting separate chips having the composite pn-junction structure 102-1(J1) and the further composite pn-junction structure 102-2 (J2) respectively for instance using bond wires or any other technology known in the art.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a composite pn-junction structure in a semiconductor substrate, wherein the composite pn-junction structure is arranged to have a predetermined first junction grading coefficient $m_1$,
   wherein the composite pn-junction structure comprises a first partial pn-junction structure and a second partial pn-junction structure,
   wherein the first partial pn-junction structure is arranged to have a predetermined first partial junction grading coefficient $m_{11}$, and wherein the second partial pn-junction structure is arranged to have a predetermined second partial junction grading coefficient $m_{12}$,
   wherein the predetermined first partial junction grading coefficient $m_{11}$ is different to the predetermined second partial junction grading coefficient $m_{12}$, with $m_{11} \neq m_{12}$, and
   wherein the predetermined first junction grading coefficient $m_1$ of the composite pn-junction structure is based on a predetermined combination of the first and second partial junction grading coefficients $m_{11}$, $m_{12}$.

2. The semiconductor device according to claim 1, wherein said predetermined combination proportionately depends on an area ratio between an active area parallel to a first main surface area of the semiconductor substrate of the first and second partial pn-junction structure.

3. The semiconductor device according to claim 1, wherein the first and second partial pn-junction structures of the composite pn-junction structure are electrically connected in parallel.

4. The semiconductor device according to claim 1, wherein the first partial pn-junction structure is arranged to have a first partial junction grading coefficient $m_{11}$ greater than 0.50, with $m_{11} > 0.50$, and wherein the second partial pn-junction structure is arranged to have a second partial junction grading coefficient $m_{12}$ greater than 0.25, with $m_{12} > 0.25$.

5. The semiconductor device according to claim 1, wherein the first partial pn-junction structure is arranged to have a first partial junction grading coefficient $m_{11}$ greater than 0.50, with $m_{11} > 0.50$, and wherein the second partial pn-junction structure is arranged to have a second partial junction grading coefficient $m_{12}$ smaller than 0.50, with $m_{12} < 0.50$.

6. The semiconductor device according to claim 1, wherein at least one of the partial pn-junction structures comprises an inversion charge layer at an interface between an oxide layer and a semiconductor material of the semiconductor device.

7. The semiconductor device according to claim 6, wherein the semiconductor material comprises a p-type doped or intrinsic bulk material, or a p-type doped or intrinsic epitaxial layer.

8. The semiconductor device according to claim 6, wherein the inversion charge layer comprises a vertical portion.

9. The semiconductor device according to claim 1, further comprising:
a further composite pn-junction structure in the semiconductor substrate, wherein the further composite pn-junction structure is arranged to have a predetermined second junction grading coefficient $m_2$,
wherein the further composite pn-junction structure comprises a further first partial pn-junction structure and a further second partial pn-junction structure,
wherein the further first partial pn-junction structure is arranged to have a predetermined further first partial junction grading coefficient $m_{21}$, and wherein the further second partial pn-junction structure is arranged to have a predetermined further second partial junction grading coefficient $m_{22}$,
wherein the predetermined further first partial junction grading coefficient $m_{21}$ is different to the predetermined further second partial junction grading coefficient $m_{22}$, with $m_{21} \neq m_{22}$, and
wherein the predetermined second junction grading coefficient $m_2$ of the further composite pn-junction structure is based on a predetermined combination of the predetermined further first and second partial junction grading coefficients $m_{21}$, $m_{22}$.

10. The semiconductor device according to claim 9, wherein the predetermined combination of the predetermined further first and second partial junction grading coefficients $m_{21}$, $m_{22}$ proportionately depends on an area ratio between an active area parallel to a first main surface area of the semiconductor substrate of the further first and second partial pn-junction structures.

11. The semiconductor device according to claim 9, wherein the further first and second partial pn-junction structures of the further composite pn-junction structure are electrically connected in parallel in the semiconductor substrate.

12. The semiconductor device according to claim 9, wherein the composite pn-junction structure and the further composite pn-junction structure are arranged to have substantially equal grading coefficients, with $m_1 = m_2$.

13. The semiconductor device according to claim 9, wherein the composite pn-junction structure is anti-serially connected to the further composite pn-junction structure.

14. The semiconductor device according to claim 13,
wherein the composite pn-junction structure is arranged to have the predetermined first junction grading coefficient $m_1$, with $m_1 = 0.50$, a predetermined first zero-bias junction capacitance $C_{J01}$, and a predetermined first junction voltage potential $V_{J1}$, and
wherein the further composite pn-junction structure is arranged to have the predetermined second junction grading coefficient $m_2$, with $m_2 = 0.50$, a predetermined second zero-bias junction capacitance $C_{J02}$, and a predetermined second junction voltage potential $V_{J2}$, and
wherein the predetermined first zero-bias junction capacitance $C_{J01}$ of the composite pn-junction structure and the predetermined second zero-bias junction capacitance $C_{J02}$ of the further composite pn-junction structure are substantially equal.

15. The semiconductor device according to claim 13,
wherein the first junction grading coefficient $m_1$ and the second junction grading coefficient $m_2$ are greater than 0.50, with $m_1$ and $m_2 > 0.50$.

16. The semiconductor device according to claim 15,
wherein the composite pn-junction structure is arranged to have a predetermined first zero-bias junction capacitance $C_{J01}$, and a predetermined first junction voltage potential $V_{J1}$, and
wherein the further composite pn-junction structure is arranged to have a predetermined second zero-bias junction capacitance $C_{J02}$, and a predetermined second junction voltage potential $V_{J2}$,
wherein the predetermined first zero-bias junction capacitance $C_{J01}$ of the composite pn-junction structure and the predetermined second zero-bias junction capacitance $C_{J02}$ of the further composite pn-junction structure are substantially equal, and
wherein the first junction grading coefficient $m_1$ and the second junction grading coefficient $m_2$ are substantially equal.

17. The semiconductor device according to claim 14, wherein the predetermined first junction voltage potential $V_{J1}$ of the composite pn-junction structure and the predetermined second junction voltage potential $V_{J2}$ of the further composite pn-junction structure are substantially equal.

18. The semiconductor device according to claim 8, wherein the semiconductor device forms an ESD device.

19. A semiconductor device comprising:
a first composite pn-junction structure having a first junction grading coefficient $m_1$, a first partial junction grading coefficient $m_{11}$, and a second partial junction grading coefficient $m_{12}$, wherein the first partial junction grading coefficient $m_{11}$ is different from the second partial junction grading coefficient $m_{12}$, and wherein the first junction grading coefficient $m_1$ is based on a combination of the first and second partial junction grading coefficients $m_{11}$, $m_{12}$; and
a second composite pn-junction structure having a second junction grading coefficient $m_2$, a first partial junction grading coefficient $m_{21}$, and a second partial junction grading coefficient $m_{22}$, wherein the first partial junction grading coefficient $m_{21}$ is different from the second partial junction grading coefficient $m_{22}$, and wherein the second junction grading coefficient $m_2$ is based on a combination of the first and second partial junction grading coefficients $m_{21}$, $m_{22}$,
wherein the first composite pn-junction structure is coupled to the second composite pn-junction structure.

20. A method comprising:
providing a first composite pn-junction structure having a first junction grading coefficient $m_1$, a first partial junction grading coefficient $m_{11}$, and a second partial junction grading coefficient $m_{12}$, wherein the first partial junction grading coefficient $m_{11}$ is different from the second partial junction grading coefficient $m_{12}$, and wherein the first junction grading coefficient $m_1$ is based on a combination of the first and second partial junction grading coefficients $m_{11}$, $m_{12}$;

providing a second composite pn-junction structure having a second junction grading coefficient $m_2$, a first partial junction grading coefficient $m_{21}$, and a second partial junction grading coefficient $m_{22}$, wherein the first partial junction grading coefficient $m_{21}$ is different from the second partial junction grading coefficient $m_{22}$, and wherein the second junction grading coefficient $m_2$ is based on a combination of the first and second partial junction grading coefficients $m_{21}$, $m_{22}$; and coupling the first composite pn-junction structure to the second composite pn-junction structure.

\* \* \* \* \*